(12) United States Patent
Carson

(10) Patent No.: US 6,965,279 B2
(45) Date of Patent: Nov. 15, 2005

(54) DOUBLE-SIDED, EDGE-MOUNTED STRIPLINE SIGNAL PROCESSING MODULES AND MODULAR NETWORK

(75) Inventor: James Crawford Carson, Sugar Hill, GA (US)

(73) Assignee: EMS Technologies, Inc., Norcross, GA (US)

( * ) Notice: Subject to any disclaimer, the term of this patent is extended or adjusted under 35 U.S.C. 154(b) by 66 days.

(21) Appl. No.: 10/623,382

(22) Filed: Jul. 18, 2003

(65) Prior Publication Data

US 2005/0035825 A1 Feb. 17, 2005

(51) Int. Cl.$^7$ ................................................. H01P 3/08
(52) U.S. Cl. ........................................ 333/116; 333/117
(58) Field of Search ................................. 333/109, 110, 333/111, 112, 113, 114, 115, 116, 117, 118, 120, 121; 342/373

(56) References Cited

U.S. PATENT DOCUMENTS

| | | | |
|---|---|---|---|
| 3,255,450 A | | 6/1966 | Butler |
| 3,295,134 A | | 12/1966 | Lowe |
| 3,731,217 A | * | 5/1973 | Gerst et al. .................. 330/56 |
| 4,231,040 A | | 10/1980 | Walker |
| 4,356,461 A | * | 10/1982 | Acoraci ...................... 333/116 |
| 4,503,434 A | | 3/1985 | Luh |

(Continued)

FOREIGN PATENT DOCUMENTS

| | | |
|---|---|---|
| JP | 08-250922 | 9/1996 |
| JP | 08-250923 | 9/1996 |
| JP | 09-093008 | 4/1997 |
| JP | 09-172317 | 6/1997 |
| JP | 2002-076726 | 3/2002 |

OTHER PUBLICATIONS

Accatino, Cad of Waveguide Butler Matrices Including Mechanical and Thermal Constraints, Abstract, 4 pages, Publication date: Sep. 25, 2001.
Accatino, 12319—MultiKaRa Deliverable D4 (update) Butler Matrices: Design & Breadboard, Information Society Technologies, Mar. 22, 2001.
Cailloce, 12319—MULTIKARA Deliverable D6 Demonstrator specifications, Information Society Technologies, Jun. 8, 2001.
Hayashi, Four–Element Planar Butler Matrix Using Half–Wavelength Open Stubs, IEEE M&WCL, Mar. 2002, vol. 12, No. 3, pp. 73–75.
Bona, Low–Loss Compact Butler Matrix for a Microstrip Antenna, IEEE Transactions on MT&Tech, Sep. 2002, vol. 50, No. 9, pp. 2069–2075.
Denidni, Microstrip 8×8 Butler Matrix for the Beamforming Network At 1.9 GHz Band, ISBN 84778.53495 ISRAM'99, pp. 747–750.

(Continued)

*Primary Examiner*—Dean Takaoka
(74) *Attorney, Agent, or Firm*—Michael J. Mehrman

(57) ABSTRACT

A class of modular, double-sided, edge-mounted printed circuit (PC) board modules and an associated modular network architecture for constructing stripline signal processing networks including high-power analog amplifiers and beam forming networks for driving multi-beam antenna systems. The stripline signal processing networks are characterized by network elements constructed from defined-length segments of transmission media configured to exhibit precisely determined phase and impedance characteristics. These circuits may also include conventional passive "lumped" electrical elements, such as resistors, capacitors and inductors; non-linear circuit elements such as diodes; and active electrical elements, such as amplifiers and transistors.

37 Claims, 15 Drawing Sheets

U.S. PATENT DOCUMENTS

| | | | | |
|---|---|---|---|---|
| 4,633,259 | A | | 12/1986 | Hrycak |
| 4,638,317 | A | | 1/1987 | Evans |
| 4,810,982 | A | | 3/1989 | Wong |
| 4,879,711 | A | * | 11/1989 | Rosen .................. 370/325 |
| 5,032,803 | A | * | 7/1991 | Koch .................. 333/116 |
| 5,086,302 | A | * | 2/1992 | Miller .................. 342/373 |
| 5,115,248 | A | * | 5/1992 | Roederer ............... 342/373 |
| 5,280,292 | A | | 1/1994 | Tondryk |
| 5,373,299 | A | | 12/1994 | Ozaki et al. |
| 5,455,742 | A | | 10/1995 | Phoy et al. |
| 5,634,208 | A | * | 5/1997 | Nishikawa et al. ....... 455/327 |
| 5,691,728 | A | | 11/1997 | Goetz et al. |
| 5,777,579 | A | | 7/1998 | Goetz et al. |
| 6,081,233 | A | | 6/2000 | Johannisson |
| 6,225,947 | B1 | | 5/2001 | Johannisson |
| 6,252,560 | B1 | | 6/2001 | Tanaka et al. |
| 6,295,035 | B1 | | 9/2001 | Holzheimer |
| 6,340,948 | B1 | * | 1/2002 | Munoz-Garcia et al. .... 342/373 |
| 6,392,160 | B1 | * | 5/2002 | Andry et al. ............ 174/261 |
| 6,480,524 | B1 | | 11/2002 | Smith et al. |
| 6,563,395 | B2 | | 5/2003 | Ishida et al. |
| 2002/0080066 | A1 | | 6/2002 | Dent |
| 2002/0190891 | A1 | | 12/2002 | Viana et al. |
| 2003/0011519 | A1 | | 1/2003 | Breglia et al. |
| 2003/0038752 | A1 | | 2/2003 | Park |

OTHER PUBLICATIONS

Shelton, Reflective Butler Matrices, IEEE Transactions on Antennas and Propagation, Sep. 1979, vol. AP-27, No. 5, pp. 651–659.

Ang, A Wide–Band Monopulse Comparator With Complete Nulling in All Delta Channels Throughout Sum Channel Bandwidth, IEEE Trans on MT&T, Feb. 2003, vol. 51, No. 2, pp. 371–373.

Barker, An Octave Bandwidth Monopulse Processor, IEEE, 0-7803-4603-Jun. 1997, 3 pages.

Ricardi, A Diplexer Using Hybrid Junctions, IEEE Transactions on Microwave Theory and Techniques, Aug. 1966, vol. MTT-14, No. 8, pp. 364–371.

Seki, 30–GHz Multibeam Antenna Using Bi–Layer Butler Matrix Circuits, IEICE Trans. Commun., Dec. 1996, vol. E79–B, No. 12, pp. 1778–1783.

Isota, A Simple Design Method of the Planar Butler Matrix Using Thin Dielectric Substrate Metalized Both Side, IEICE Trans. Electron, Feb. 2003, vol. E86–C, No. 2, pp. 162–167.

Hayashi, Radial Open Stub and Its Application to a Simple Design of a Four–element Planar Butler Matrix, IEICE Trans. Elec., May 2002, vol. E85–C, No. 5, pp. 1164–1169.

Uehara, A Planar Sector Antenna for Indoor High–Speed Wireless Communiction Systems, IEICE Trans. Commun., Dec. 1996, vol. E79–B, No. 12, pp. 1773–1777.

Angelucci, Multiport Power Amplifiers for Mobile–Radio Systems Using Microstrip Butler Matrices, IEEE, 1994, 0-7803-2009-Mar. 1994, pp. 628–631.

* cited by examiner

BACK SIDE CIRCUIT PORTION

FRONT SIDE CIRCUIT PORTION

BACK SIDE CIRCUIT PORTION

FRONT SIDE CIRCUIT PORTION

DOUBLE-SIDED, EDGE-MOUNTED STRIPLINE SIGNAL PROCESSING MODULES AND MODULAR NETWORK

TECHNICAL FIELD

The present invention relates to stripline signal processing systems for radio and microwave frequency applications and, more particularly, relates to a class of double-sided, edge-mounted printed circuit (PC) modules and an associated modular network architecture for constructing stripline signal processing networks including high-power analog amplifiers and beam forming networks for shaped beam and/or multi-beam antenna systems.

BACKGROUND OF THE INVENTION

Stripline signal processing circuits can be used to implement a variety of analog signal operations on electromagnetic energy propagating within the circuit at radio frequency (RF) and microwave transmission frequencies. Generally stated, a stripline signal processing circuit, as that term is used in this specification, is a circuit that includes one or more transmission media segments of specified lengths and impedance characteristics, which are typically interconnected into a network, and which exhibit a desired frequency response (also called a "transfer function") that performs a desired signal processing operation on electromagnetic energy propagating through the circuit. The term "microstrip" is commonly used to refer to stripline circuits having two conductors in which the transmission media segments are exposed to one or more dielectric materials on a first side backed by a conducting plane and one or more dielectric materials including air on a second side without a second conducting plane. The term "tri-plate stripline" is commonly used to refer to stripline circuits that include transmission media segments are exposed to one or more dielectric materials on both sides bounded by a conducting plane on each side. In addition, the terms "air microstrip" or "air stripline" are commonly used to refer to stripline circuits in which the transmission media segments are exposed to air on both sides. All of these circuit configurations fall within the class of circuits referred to as "stripline" in this specification.

A stripline circuit often does, but does not necessarily, include one or more lumped (also called "discrete" or "conventional") electric elements, such as resistors, capacitors and inductors interconnected with the stripline segments within the circuit. These circuits may also, but need not necessarily, include active elements or stages such as active amplifier stages, and non-linear elements such as diodes, transistors, and other conventional circuit elements. In addition, these circuits may also, but need not necessarily, include other types of transmission media segments, such as coaxial cable, tubular waveguide, and so forth, as well as junctions between different types of transmission media. Because the electromagnetic energy is processed by the circuit as the signal propagates through the circuit, these circuits are typically characterized by a network of stripline segments connected between a plurality of input ports and a plurality of output ports, in which a desired signal processing operation is performed on the signal as it propagates from the input ports to the output ports.

Stripline signal processing circuits may be used to implement a wide range of functions, such as signal dividing, signal amplification, signal combining, signal encoding, and so forth. In general, they are typically used to construct relatively simple functions or modules, as described above, which are combined into more complicated structures configured to implement higher-level components, such as beam forming networks, hybrid matrix amplifiers, radio frequency amplifiers, and so forth. These higher-level components, in turn, may be interconnected and controlled to implement a wide range of commercial devices, such as radars for missiles and missile defense, satellite communication systems, wireless telephone base station antennas, Doppler radars, and many others.

Stripline signal processing circuits are typically referred to as "reciprocal" when the transfer function is the same for a signal propagating from the input ports to the output ports as it is for a signal propagating from the output ports to the input ports. Reciprocal signal processing circuits are particularly well suited for use in radar systems that both emit and receive electromagnetic energy through the same transmission path. Orthogonal signal processing circuits are a particularly important class of signal processing circuits that are characterized by a plurality of input ports that are isolated from each other. This allows the signal injected into each input port to be independently controlled without substantial interference from the other input ports. Reciprocal orthogonal circuits, even more specifically, are an important class of signal processing circuits that are well suited to a range of applications using analog amplifiers and beam forming networks. The reciprocity property can be obtained through the reuse of a portion or all of a passive circuit for bi-directional signal flow.

As noted above, an orthogonal circuit includes a number of isolated input ports, and also typically includes a plurality of output ports that each receive a weighted, phase-adjusted combination of the input signals injected into the input ports. That is, the output signal at each output port typically includes a linear combination or "superposition" of input components, in which each input component is an amplitude-weighted, phase-adjusted portion or division of the signal injected into one of the input ports. In other words, the input signals are isolated from each other, and each input signal is divided into a number of weighted and phase-adjusted components that are delivered to the output ports, such that each output port produces an amplitude weighted and phase-adjusted linear combination of the input signals. In addition, the input and output impedances of the orthogonal circuit are typically matched across connecting junctions or ports so that the ideal non-absorbing circuit is theoretically lossless for signal flow between ports. That is, the orthogonal circuit does not absorb or reflect back any of the energy injected into the input ports, but instead divides and delivers all of the input energy to the output ports, where they are combined into amplitude weighted, phase-adjusted linear combinations of the input signals.

Hybrid circuits are a subclass of orthogonal signal processing networks characterized by two inputs, two outputs, and a division of energy from each input port to the output ports. The term "hybrid junction" typically refers to a hybrid circuit in which there is an equal division of power from each input port to the output ports. A "hybrid coupler," on the other hand, typically refers to a hybrid circuit in which the power division is generally unequal. A hybrid junction in which the phase shift from each input port to the two output ports is zero degrees (0°) and ninety degrees (90°), respectively, is known as a "quadrature" junction or circuit; and a hybrid junction in which the phase shift from each input port to the two output ports is zero (0°) degrees and one-hundred eighty degrees (180°), respectively, is known as a "magic T" junction or circuit. These circuits are also otherwise known as 0°/90° and 0°/180° hybrids. These well known building blocks are usually reciprocal and form the basic building blocks for constructing higher-level orthogonal circuits, which are often referred to as hybrid matrices, Butler matrices, beam forming networks, hybrid matrix amplifiers, RF amplifiers, diplexers, monopulse comparators, and so forth. These building blocks can be used in conjunction with other types of junctions including non-isolating reactive tee junctions and can be used with various types of phase or time delay elements or components.

More particularly, a Butler matrix is a type of higher-level reciprocal orthogonal passive circuit characterized by an equal number of input ports and output ports, and equal power division of each input signal to the several output ports. The Butler matrix circuit provides equal power signal amplitudes delivered to each output port. A three-by-three Butler matrix includes three input ports and three output ports, a four-by-four Butler matrix includes four input ports and four output ports, an eight-by-eight Butler matrix includes eight input ports and eight output ports, and so forth. In addition, other well known circuits and circuit components can be constructed from hybrid junctions and other components such as phase shifters and resistors used for impedance matching and for analog signal processing. For example, monopulse comparators, diplexers, analog amplifiers, and beam steering circuits can be constructed in this manner. An important example of such a circuit is a high-level Butler matrix, which may be used to implement beam forming networks (BFNs) for multi-beam antenna systems with a large number of beams. These high-level Butler matrices may be constructed from complexes of four-by-four Butler matrices, which in turn may be constructed from complexes of hybrid junctions and other circuit elements, such as phase shifters.

For constructing high-level Butler matrices using hybrid junctions, see "Multiple Beams from Linear Arrays" by J. P. Shelton and K. S. Kelleher, published in the March 1961 "IRE Transactions on Antennas and Propagation." For constructing monopulse comparators using hybrid junctions, see "A Wide-Band Monopulse Comparator With Complete Nulling in All Delta Channels Throughout Sum Channel Bandwidth" by Kian Sen Ang, Yoke Choy Leong and Chee How Lee, published in the February 2003 "IEEE Transactions on Microwave Theory and Techniques." For constructing diplexer circuits using hybrid junctions, see "A Diplexer Using Hybrid Junctions" by Leon J. Ricardi published in the August 1966 "IEEE Transactions on Microwave Theory and Techniques." For constructing hybrid matrix amplifiers (HMAs) using hybrid junctions, see "Multiport Power Amplifiers For Mobile-Radio Systems Using Microstrip Butler Matrices" by A. Angelucci, P. Audagnotto, P. Corda, and B. Piovano, published in the June 1994 Antennas and Propagation Society International Symposium. Those skilled in the art will appreciate that other devices, and in particular more complicated HMAs and beam forming networks for multi-beam antenna systems, may be constructed using the principles and techniques taught in this specification and in the documents referenced above, which are incorporated herein by reference.

In particular, hybrid junctions form the basic building blocks for the beam forming networks that are used in shaped beam and/or multi-beam antenna systems having a wide range of applications including, but not limited to, antennas for wireless telephone base stations, radars, missile guidance systems, missile defense systems, satellite surveillance systems, and satellite communication systems. In general, component beams may be pointed in different directions so to allow for substantially isolated input ports corresponding to each component beam. Component beams can be combined in various ways to form composite beams. Each beam may be encoded with beam-specific information and combining can occur for analog or digital signals.

To create these capabilities, the multi-beam antenna system includes a beam forming network or circuit that transfers signal energy from one or more input ports to a plurality of output ports operatively connected to one or more antenna elements to emit or receive the desired beams. Although the most critical design considerations may vary from application to application, it is generally desirable to manufacture beam forming networks that are inexpensive and easy to manufacture, repeatable in performance characteristics, light in weight, small in size, reliable and durable in construction, low in RF signal losses, low in noise generation, easy to ground properly, and easy to maintain. Although other design objectives may also be important in a particular application, this list includes many of the most important design considerations for many applications.

A number of these design objectives can be satisfied by manufacturing the signal processing circuits on printed circuit (PC) boards constructed from a dielectric substrate and using stripline carried on the dielectric substrate as the transmission media. The dielectric substrate typically has a ground plane attached to one side and the stripline carried on the other side. This configuration produces a circuit that can be mass produced on a PC board using conventional etching technology and processes. The resulting device exhibits low manufacturing costs, reliability, durability, repeatable performance characteristics, and accessible and solid ground characteristics. These circuits can be readily designed to exhibit low RF signal losses and low noise generation. The drawback in using this construction paradigm is that beam forming networks using hybrid junctions are often characterized by crossover points in which stripline segments must pass by each other physically without interfering with each other electrically.

On a PC board, the need for crossovers presents a design challenge because the stripline segments must remain physically separated from each other to avoid electrical interconnection (if the stripline segments physically touch each other) or radiating interference or cross-talk (if the stripline segments come too close together without physically touching each other). A number of techniques have been developed to implement crossovers for stripline signal processors implemented on PC boards, such as "flying bridge" sections of PC board that physically jump one stripline segment over another, coaxial cable links to cross each other, and multiple layered PC board constructs with conductors suspended in air and extending between PC boards to implement crossovers. Each of these designs increases the cost of the circuit, reduces the physical ruggedness of the circuit, and has the potential to increase noise generation and RF signal loss, particularly at junctions between different types of transmission media segments. More importantly, these somewhat clumsy solutions to the crossover problem greatly complicate the manufacturing process because the entire circuit cannot be arranged on a single PC board using stripline transmission media segments formed into the PC board that can then be manufactured through a conventional etching techniques and processes.

Another technique employs a circuit known as a "zero-dB crossover" that can be comprised of two cascaded quadrature hybrid junctions. Although this type of crossover can be implemented on a single flat PC board without physical trace jumps, it occupies a relatively large section of PC board space. Because the crossover is a basic building block that is repeated many times in creating a higher-level beam forming network, the significant board size required to implement the zero-dB crossover quickly multiplies into an overly large and expensive PC board as the complexity of the bream forming network increases.

In addition to the problem of crossovers, stripline signal processing circuits arranged on PC boards must maintain proper physical spacing between the stripline segments to avoid radiating interference. Further, designing each stripline segment to have a precisely determined phase characteristic at RF and microwave operational frequencies also requires the stripline circuit to be physically arranged on the printed circuit board in a manner that consumes a relatively large amount of planar board space. To maintain proper spacing and minimize the number of crossovers required, and to take advantage of the natural symmetry of the circuits, they are typically arranged out linearly, with the inputs ports spaced along one side and the output ports spaced along the other side of the stripline circuit. The transfer function of the stripline circuit then processes the signal as it propagates across the PC board from the input ports to the output ports.

For this type of circuit configuration operating at a carrier frequency of 1.92 GHz (which is the center frequency of the authorized PCS wireless telephone band), a conventional hybrid junction layout typically occupies PC board space that is approximately one quarter of a square wavelength "in the guide" ($\lambda_g$) (e.g., an approximately square section of PC board that is $\lambda_g/2$ in length on each side). A typical dielectric material (e.g., PTFE Teflon®) having a dielectric constant equal to 2.2 ($\in_r=2.2$) can be used to construct PC boards that will exhibit an effective dielectric constant of 1.85 ($\in_{reff}=1.85$) for microstrip transmission media segments exposed to the PC board on one side and exposed to air on the other side. For this type of PC board circuit, the wavelength in the guide ($\lambda_g$) (i.e., the wavelength as propagating in the stripline transmission media as laid out on the PC board with one side exposed to the dielectric substrate and the other side exposed to air) is approximately 4.52 inches (11.48 cm), which results in a side dimension of the PC board required to implement a quadrature hybrid junction of approximately 1.13 inches (2.87 cm). It is well known to someone familiar with the art that using a substrate material having a higher dielectric constant value can reduce the overall size of the circuit. Materials with substantially higher dielectric constant values can be substantially more expensive, can have higher RF signal losses, and can have RF power handling limitations that are a lower value due to reduced stripline trace width values. It is desirable to have a circuit with sufficiently wide conducting trace width values and low RF signal loss characteristics for conditions of moderate to high operational RF power levels. Generally, the use of a substrate material with a low dielectric constant value is often desirable when RF power levels are a significant design consideration.

Using this technology and connecting four hybrid junctions together to construct a four-by-four Butler matrix occupies PC board space that is approximately one square wavelength in the guide ($\lambda_g$), which at a carrier frequency of 1.92 GHz results in a side dimension of the PC board required to implement the four-by-four Butler matrix of at least 4.52 inches (11.48 cm) using microstrip on a dielectric material having a dielectric constant equal to 2.2 ($\in_r=2.2$). The physical size of the PC board starts to become unwieldy and expensive as the number of hybrid junction elements increases beyond the eight to 16 element level. For example, a 64×64 Butler matrix requires 48 hybrid junctions and associated crossovers, and a 128×128 Butler matrix requires 160 hybrid junctions and associated crossovers. Arranging a stripline signal processing circuit on a planar PC board in the conventional manner for these circuits would result on a very large PC board that would be very expensive to manufacture and install in a secure manner.

An approach to solving some of the problems associated with PC board stripline signal processing circuit design is provided in Tanaka et al., U.S. Pat. No. 6,252,560, which describes a four-by-four Butler matrix that is arranged on a double-sided dielectric PC board with a ground plane located in the center. See Tanaka at FIG. 7. This allows the first stage hybrid junctions to be carried on a first side of the double-sided dielectric PC board, and the second stage hybrid junctions to be carried on the other side of the double-sided dielectric PC board. Crossovers are conveniently implemented using tap-through connections between the stripline circuits located on opposite sides of the PC board. This provides an elegant, low noise and space effective mechanism for implementing the crossovers. However, the circuit is still laid out linearly with the input ports located on the other side of the circuit from the output ports. In addition, the Tanaka reference shows the Butler matrix implemented on a common board with a power divider network feeding a set of patch radiators. Tanaka does not teach or suggest further steps to reduce the physical size of the Butler matrix circuit. Nor does it teach or suggest mechanisms for minimizing the PC board space required to implement higher-order analog signal processing circuits.

Accordingly, a continuing need exists for stripline signal processing networks that are inexpensive and easy to manufacture, repeatable in performance characteristics, light in weight, small in size, reliable and durable in construction, low in RF signal losses, low in noise generation, easy to ground properly, and easy to maintain. More specifically, a need exists for improvements in stripline signal processing circuit design that reduce the PC board space required to implement higher-order stripline signal processing circuits.

SUMMARY OF THE INVENTION

The present invention meets the needs described above in double-sided, edge-mounted modular printed circuit (PC) boards and an associated modular network architecture for constructing stripline signal processing networks including high-power analog amplifiers and beam forming networks (BFNs) for use in shaped beam and/or multi-beam antenna systems. Each module is manufactured from a double-sided dielectric circuit board with a ground plane located in the center. Unlike prior double-sided PC board designs, however, the present invention includes input and output interface ports along a common interface edge defined by one or both sides of the double-sided circuit board. This allows non-crossing circuit portions to be carried on each side of the double-sided circuit board, with crossovers implemented with tap-through connections between the circuit portions, and input-output ports located along the interface edge, to create an edge-mounted system for constructing modular signal processing networks from a system of double-sided, edge-mounted modules.

Typically, a first stage of the circuit extends linearly away from input ports located at the interface edge, tap-through connectors participate in the implementation of crossovers to a second stage of the circuit located on the other side of the double-sided PC board. The second stage circuit then extends back toward output ports, which are also located at the interface edge. In this manner, the first and second stages of the circuit overly each other on opposite sides of the double-sided PC board, and all input and output ports are located along a common interface edge. In addition, the circuit portions themselves, typically hybrid junctions and circuit portions that include complexes of hybrid junctions, may include sinuous stripline trace elements that reduce the length of the PC board in a desired dimension. For example, first and second stage complexes of hybrid junctions may be laid out using sinuous trace elements to minimize the depth of the PC board extending away from the interface edge.

The results is a compact, edge-mounted, double-sided, modular signal processing PC board design that is well suited to assembling higher-order circuits from complexes of lower-order, edge-mounted modules. This architecture may be used to construct hybrid matrix amplifiers (HMAs) and beam forming networks for multi-beam antenna systems that exhibit many advantages over prior HMA and beam forming networks including decreased size, decreased cost, standardization of module design, scalability, repeatability of manufactured products, ease of construction, and ease of repair and maintenance. Circuit configurations implemented in this manner can also be readily configured to exhibit low noise generation, low power and signal losses, and rugged physical construction.

Generally described, the invention may be implemented as a stripline signal processing module that includes a first planar dielectric substrate that defines an edge, a second planar dielectric substrate that defines an edge, and a ground plane. The first dielectric substrate, the second dielectric substrate, and the ground plane are adhered together in an overlaying configuration with the ground plane located between the first and second dielectric substrates and the edges aligned to form an interface edge. A first stripline circuit is carried on the first dielectric substrate, and a second stripline circuit is carried on the second dielectric substrate. The module also includes one or more input ports and one or more output ports located at the interface edge and electrically connected to the first or second stripline circuits. The first and second stripline circuits are configured to receive propagating signals at the input ports, perform a signal processing operation on the received propagating signals, and deliver processed signals to the output ports.

Typically, the first dielectric substrate, the second dielectric substrate, and the ground plane are approximately coextensive in their planar dimensions to form a double-sided dielectric PC board with a conducting ground plane sandwiched in the middle. In addition, the first and second stripline circuits are typically constructed from stripline that is exposed to the dielectric substrate on one side and exposed to air on the opposite side. The module may also include one or more electrical connections between the first and second stripline circuits, which are typically implemented as tap-through connectors passing through and insulated from the ground plane. Further, the first and second stripline circuits may be non-crossing, and the electrical connections between the stripline circuits may participate in the formation of crossovers connecting the stripline circuits to form orthogonal signal processing circuits, such as circuits comprised of hybrid junctions.

In particular, the first and second stripline circuits may implement first and second stage orthogonal beam forming networks, respectively, that are combined to form a multi-stage orthogonal beam forming network. For example, the multi-stage orthogonal beam forming network may be a two-by-four beam steering circuit, a diplexer filter circuit with at least three ports, a three-by-three Butler matrix circuit, a four-by-four Butler matrix circuit, an eight-by-eight Butler matrix circuit, a four-by-four monopulse comparator circuit, a three-by-four monopulse comparator circuit, an eight-by-eight monopulse comparator circuit, or a three-by-twelve monopulse comparator circuit, and other like constructions. These modules may then be combined to construct higher-order machines, such as HMAs and beam forming networks for shaped beam and/or multi-beam antennas.

For all of these modules, the stripline circuits may include one or more sinuous trace legs configured to exhibit a desired phase and impedance characteristic while reducing the displacement of the trace in a selected dimension. For example, the first and second stripline circuits may implement a four-by-four Butler matrix circuit configured for an operational carrier frequency, in which the planar dimensions of the first dielectric substrate, the second dielectric substrate, and the ground plane are less than one and one-half times the wavelength of the carrier frequency in the strip transmission media. More specifically, the planar dimensions may include a length dimension in the direction of the interface edge that is less than one and one-half times the wavelength of the carrier frequency in the guide; and a width dimension perpendicular to the interface edge that is less than one-half times the wavelength of the carrier frequency in the guide. Even more particularly, the length may be approximately equal to the wavelength of the carrier frequency in the strip transmission media, and the width may be approximately one-fourth times the wavelength of the carrier frequency in the strip transmission media.

The invention may also be embodied as a modular stripline signal processing network including an interconnected set of network modules, in which each network module includes a first stripline circuit located on a first side of a double-sided dielectric substrate board, a second stripline circuit located on a second side of the double-sided dielectric substrate board, and one or more input ports and output ports located along an interface edge defined by the dielectric substrate board. In this case, each network module is configured to receive propagating signals at the input ports, perform a signal processing operation on the received propagating signals, and deliver processed signals to the output ports.

The interface ports for each network module, as described above, may be edge-connected to another network board through soldered connections. Alternatively, they may be configured for removable edge-connection to another network board through separable connections, for example by implementing the interface ports as blind-mate coaxial connectors. Typically, each network module implements a lower-order hybrid junction circuit, and the interconnected set of network modules combines the network modules to implement a higher-order hybrid junction circuit. For example, each lower-order hybrid junction circuit may be a three-by-three, a four-by-four, or an eight-by-eight Butler matrix circuit. And the higher-order hybrid junction circuit may include at least sixteen input ports and sixteen output ports. For example, the higher-order hybrid junction circuit may be a 64×64 or 128×128 Butler matrix used as a beam forming network for a multi-beam antenna. Alternatively, the higher-order hybrid junction circuit may be a multi-stage high-power HMA including scores of hybrid junctions. Many other end products may be constructed using the modular, edge-connected, double-sided dielectric PC board configuration enabled by the present invention.

In view of the foregoing, it will be appreciated that the present invention avoids the drawbacks of prior methods for implementing stripline signal processing circuits, such as analog amplifiers and beam forming networks, on PC boards. The specific techniques and structures for creating stripline signal processing modules, and higher-order modular signal processing networks constructed from complexes of lower-order network modules, and thereby accomplishing the advantages described above, will become apparent from the following detailed description of the embodiments and the appended drawings and claims.

DETAILED DESCRIPTION OF THE EMBODIMENTS

Figure 1:
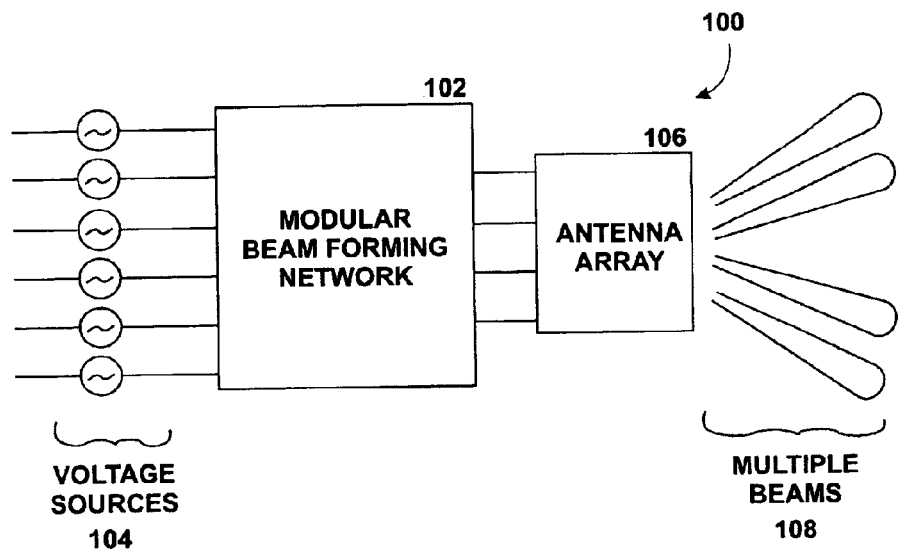
FIG. 1 is a block diagram of a multi-beam antenna system including a modular beam forming network embodying the present invention.

The present invention relates to a class of double-sided, edge-mounted printed circuit (PC) modules and an associated modular network architecture for constructing stripline signal processing networks including high-power analog amplifiers and beam forming networks for use in multi-beam antenna systems. The stripline signal processing networks are characterized by network elements constructed from defined-length segments of stripline configured to exhibit precisely determined phase and impedance characteristics. These circuits may also include conventional passive "lumped" electrical elements, such as resistors, capacitors and inductors; non-linear circuit elements such as diodes; and active electrical elements, such as amplifiers and transistors.

The stripline segments are typically constructed from conductive stripline, such as tin-covered copper traces, carried on a dielectric PC board substrate constructed from, for example, PTFE Teflon® laminate impregnated with glass fibers. Although other types of dielectric PC board substrates may be used, this particular substrate exhibits desirable dielectric, cost, hardness, durability, consistency and etching characteristics that makes it well suited to mass producing PC boards for relatively low cost, high-production applications, such as wireless telephone base station antennas and similar applications. A double-sided PC board can be readily manufactured by using a dielectric adhesive layer to adhere a first PC board carrying an attached ground plane to a second PC board without an attached ground plane to create an integral double-sided dielectric PC board with a ground plane sandwiched in the middle.

Large planar sheets of this material may then be mass produced, etched and cut into multiple PC boards or modules in which each resulting module has two sides of dielectric PC board, each carrying an etched stripline circuit, and a center ground plane. Typically, the dielectric PC board sides and the center ground plane are cut with a common die, and as a result are substantially coextensive in planar dimensions. For many applications, the stripline circuits on each side of the board may be non-crossing and formed entirely of etched stripline, which avoids the need for coaxial links, "flying bridge", "air bridge", "zero dB crossover", or other devices to implement crossovers that might add noise, increase size, cost and fragility to the board. Connections between stripline circuits located on either side of the board are typically implemented through tap-through connectors, and the input and output ports are located along a common interface edge. In addition, for some applications the modules may include connection points for solder-mounting discrete electrical elements, such as resistors, capacitors, inductors, diodes, transistors, and amplifiers into the stripline circuits.

A variety of standard and special purpose "lower-level" modules, such as quadrature hybrids, diplexer filters, amplifier power dividers, amplifier crossovers, monopulse comparators, Butler matrix circuits, and customized beam forming networks may be constructed in bulk this manner. These modular components may then be assembled together in an edge-mounted "tree" configuration to create higher-level stripline signal processing machines, such as high-power hybrid matrix amplifiers, other types of RF amplifiers, beam forming networks for multi-beam antenna systems.

In particular, lower-level orthogonal circuit modules with well-known properties, such as Butler matrices, quadrature hybrids, "magic-'T'" hybrids, and monopulse comparators may be mass produced inexpensively, with tight performance tolerances, and with desirable size, ruggedness and durability qualities. These basic building blocks of bi-directional signal processing systems implemented in double-sided, edge-mounted modules may then assembled to construct higher-order signal processing networks. These higher-order networks, in turn, provide the signal processing network infrastructure required to assemble a wide range of commercially and scientifically important high-power and multi-beams systems, such as multi-beam Doppler radar systems, multi-beam missile defense systems, missile guidance systems, satellite reconnaissance systems, satellite communication systems, and the like. Those skilled in the art will appreciate that the standardization of the basic building blocks of orthogonal signal processing systems into double-sided, edge-mounted modules that can be inexpensively mass produced and readily assembled into higher-order signal processing machines represents a major advance in this particular technology.

Further, the modular design of complex multi-beam and high-power amplifier using standardized double-sided, edge-mounted modules with non-crossing stripline circuits on each side of the PC board and cross-board connections implemented through tap-through connectors exhibit other desirable design characteristics. For example, the modules may be edge-connected together with separable connectors, such as blind-mate coaxial connection to allow easy removal and replacement of individual components. The "tree" nature of edge-connected module construction produces a three-dimensional processing unit, as opposed to a huge planar configuration, which is easier to move and install, reduces the required bracing, reduces the weight, reduces wind and drag concerns for outdoor installations, and provides inherent ventilation corridors within the three-dimensional processing unit. Basically, the double-sided, edge-mounted modular allows much more processing capability to be manufactured and installed, much less expensively, within in any given physical envelope.

In addition, the conducting ground plane located in the middle of the double-sided dielectric board isolates the circuits on either side of the board from radiating interference from each other, which allows the circuits to be located close to each other in space yet maintain electric isolation. The ability to deploy the stripline circuits in each side of the board in non-crossing configurations, which crossovers implemented with tap-through connections, produces a low-noise, low-loss and rugged board design. The use of edge-connected I/O further reduces the cost and simplifies the design of the modular systems by avoiding the need for free spans of conductors, coaxial cable or other types of links between boards other than the edge connections located at edge-mounted junctions between boards.

The inventor of the present system has also developed a technique for using sinuous stripline traces to reduce the size of modules in a desired planar dimension. This innovation, combined with the double-sided, edge-mounted board design, enables compaction of planar stripline signal processing PC board circuits to an extent that has not been achieved before for circuit constructions using low dielectric constant substrate materials. For a particular example, the conductive stripline transmission media segments may be formed into the PC board using a conventional PC board etching technique. The PTFE Teflon® dielectric material exhibits a dielectric constant equal to 2.2 ($\in_r=2.2$), which results in stripline segments exposed to the PC board on one side and exposed to air on the other side exhibiting an effective dielectric constant of 1.85 ($\in_r=1.85$). For this type of PC board circuit operating at a carrier frequency of 1.92 GHz (the center of the authorized PCS wireless telephone band), the wavelength in the guide ($\lambda_g$) (i.e., the wavelength as propagating in the stripline as carried on the PC board with one side of the stripline exposed to the dielectric substrate and the other side exposed to air) is approximately 4.52 inches (11.48 cm), which results in a side dimension of the PC board required to implement a hybrid junction in a conventional planar layout of approximately 2.26 inches (5.74 cm). Using planar technology and connecting four hybrid junctions together to construct a four-by-four Butler matrix occupies PC board space that is approximately one square wavelength in the guide ($\lambda_g$), which results in a side dimension of the PC board required to implement the four-by-four Butler matrix of 4.52 inches (11.48 cm). It will be appreciated that the wavelengths change for different carrier frequencies and for PC board substrates with different dielectric constant values, for surrounding media other than air, and for configurations in which a dielectric material is located on both sided of the stripline circuit, which could be implemented for the entire board or for selected segments. For this reason, the board dimensions are preferably expressed as multiples of $\lambda_g$ rather than absolute lengths.

Using the sinuous stripline traces combined with the double-sided, edge-mounted board design allows a four-by-four Butler matrix to be implemented on a board that that is approximately $\lambda_g$ (i.e., 4.52 inches or 11.48) cm along the interface edge, but is only $\lambda_g/4$ (i.e., 1.13 inches or 2.27 cm) in the direction extending away from the interface edge. This represents a reduction to one-forth the board size of that required to implement the four-by-four Butler matrix using the conventional layout. For a mass-produced, highly price sensitive item, such as wireless telephone base station antennas, this reduction in board size alone represents a significant cost advantage. This advantage, together with the other benefits of the modular design, including the elegant, low-noise, low-loss crossover implementation through tap-through connections, low cost, small size, low weight, and ease of manufacturing result in a major improvement in stripline signal processing circuit design.

Turning now to the figures, in which similar reference numerals indicate similar elements in the several figures, FIG. 1 is a block diagram of a multi-beam antenna system 100 including a modular beam forming network 102 embodying the present invention. As noted above, many different types of stripline signal processing modules and modular systems may be constructed using the double-sided, edge mounted PC board modular technology of the present invention. Multi-beam antenna systems are a important class of these system, which can be used to drive wireless base station antennas, Doppler radar systems, satellite communication systems, missile defense and guidance systems, and a range of other devices that are generally characterized by a plurality of voltage sources 104 feeding a modular, double-sided, edge-mounted stripline beam forming network 102, which in turns drives an antenna array 106 to produce multiple beams 108. In general, each of these beams may include a beam component from each of the voltage sources 104, and may be independently steered and encoded with information. Also, each of these beams may be combined to form one or more composite beams that can produce a "shaped beam" coverage pattern.

Figure 2:
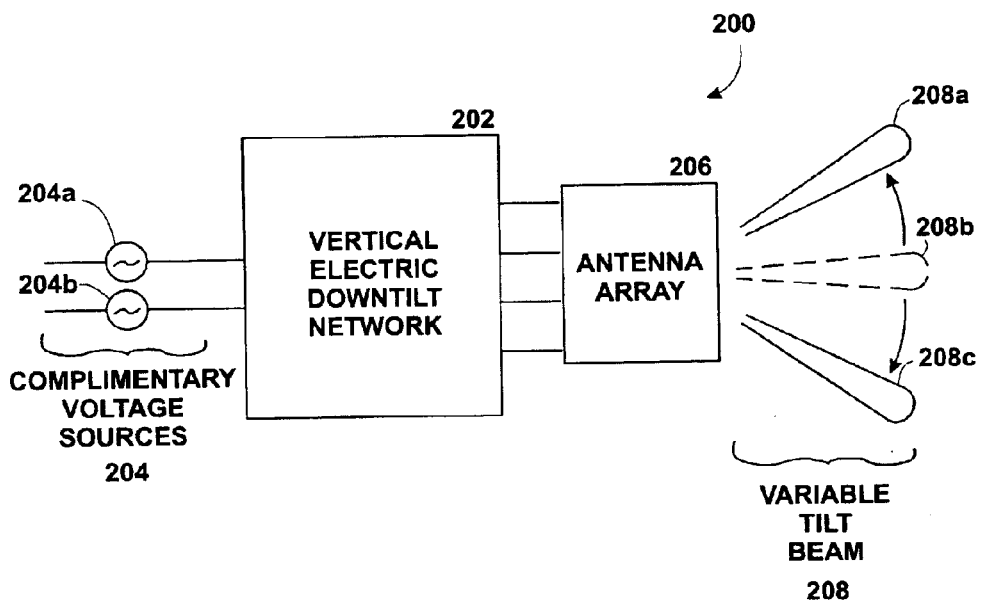
FIG. 2 is a block diagram of a vertical electrical downtilt antenna system including a modular beam forming network embodying the present invention.

FIG. 2 is a block diagram of a vertical electrical downtilt ("VED") antenna system 200, which is simplified single-beam variant similar to the multi-beam antenna system 100. This system includes a pair of complimentary voltage sources 204 that typically produce in-phase voltage signals that vary in magnitude inversely in proportion to each other. That is, the voltage sources 204a and 204b are typically in phase with each other throughout the range of control, and the amplitude of voltage source 204a increases proportionately as the amplitude of voltage source 204b decreases, and vice versa, in a complimentary fashion throughout the range of control. Typically, this type of complimentary voltage source pair can be generated by splitting a single constant-amplitude voltage signal into two channels and varying the power division between the two channels. The pair of complimentary voltage sources 204 feeds a modular, double-sided, edge-mounted vertical electrical downtilt network 202. This network produces antenna drive signals that cause an antenna array 206 to generate a single beam 208 propagating in a direction that tilts downward and upward in response to changes in the voltage division between the voltage sources 204a and 204b. For example, the beam 208 may be at its highest pointing direction 208a when all of the drive power is directed through the voltage source 204a, may be at its lowest pointing direction 208b when all of the drive power is directed through the voltage source 204b, may be at a central pointing direction 208c when the drive power is divided equally between the voltage sources 204a and 208b, and may vary smoothly between these pointing directions as the power division through the voltage sources 204a and 208b is varied smoothly.

Figure 3A:
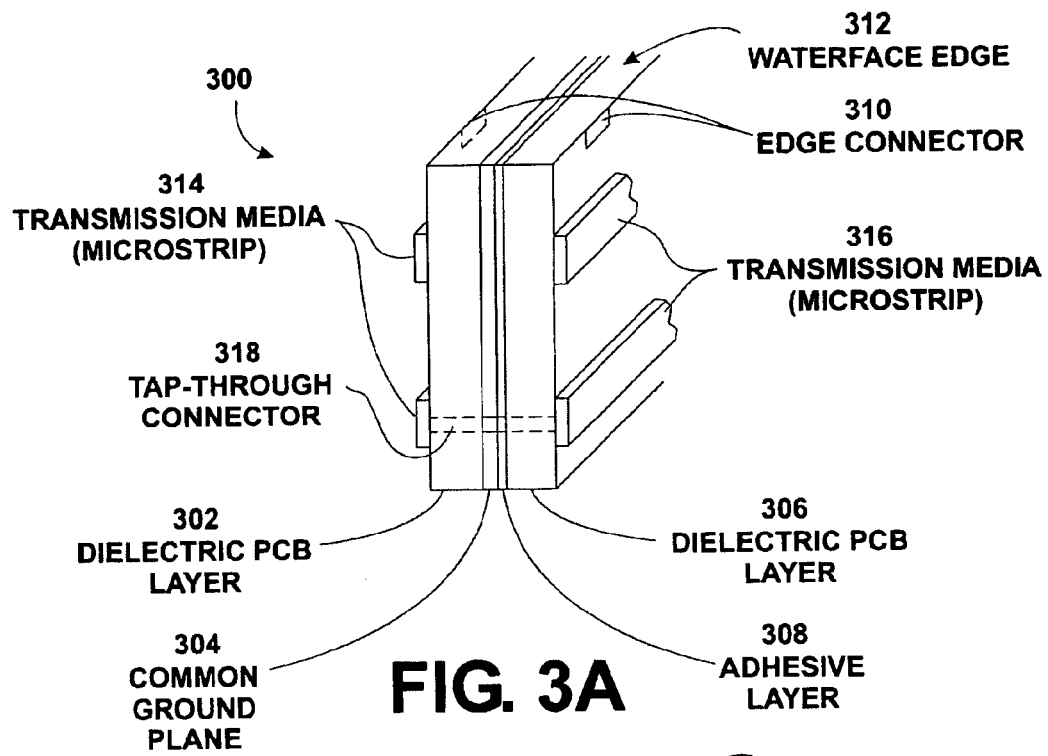
FIG. 3A is a perspective view of a conceptual design for a double-sided, edge-mounted stripline signal processing module.

FIG. 3A is a perspective view of a conceptual design for a double-sided, edge-mounted stripline signal processing module 300. This particular example includes a first dielectric PC board 302 with an integral ground plane 304 adhered to a second dielectric PC board 306 by a dielectric adhesive 308. The planar dimensions of the PC board dielectric substrate sides 302, 306 are coextensive with the common ground plane 304 layer to create a double-sided dielectric PC board with a common ground plane sandwiched in the middle. Edge connectors 310 are located along a common interface edge 312 to permit edge mounting of the module 300 to a socket or another PC board. The first side 302 of the double-sided dielectric PC board carries a first stripline circuit 314, typically a conductive stripline formed into the PC board through a conventional etching process. Similarly, the second side 306 of the double-sided dielectric PC board carries a second stripline circuit 316, again a conductive stripline formed into the PC board through a conventional etching process. As needed, the first and second stripline circuits 314, 316 are connected to the ground plane 304 layer with ground connections. The stripline circuits 314, 316 may also be connected to each other with one or more tap-through connectors 318 that pass through, but are electrically isolated from, the ground plane 304 layer. However, a designer could wrap a connector around an edge of the board to create a less elegant but functional electrical connection between the first and second stripline circuits 314, 316.

As discussed previously, in certain embodiments the first and second stripline circuits 314, 316 are non-crossing, and the tap-through connectors 318 participate in the implementation of crossovers to implement a hybrid coupler, hybrid junction, hybrid matrix, or other orthogonal signal processing module characterized by low-level hybrid components connected together through crossovers to create a higher-level circuit. For example, non-crossing first stage hybrid junctions of a four-by four Butler matrix may be implemented on the first side 302 of the double-sided PC board 300. These first stage hybrid junctions include input ports located along the interface edge 312, and circuits are laid out to extend away from the interface edge. The second stage hybrid junctions of the four-by four Butler matrix are then implemented on the second side 306 of the board 300 and interconnect with the first stage hybrid junctions through crossovers located away from the interface edge 312. The second stage hybrid junctions then run back toward the interface edge 312, where they terminate at output ports located along the interface edge. The crossovers required to connect the first and second stage hybrid junctions into the four-by four Butler may be implemented through a combination of tap-through connectors 318 and strategic positioning or overlaying of the first and second stripline circuits 314, 316 with respect to each other. This creates a compact, ruggedly constructed, double-sided, edge-mounted four-by-four Butler matrix module, with all eight inputs and output ports located along the interface edge.

Figure 3B:
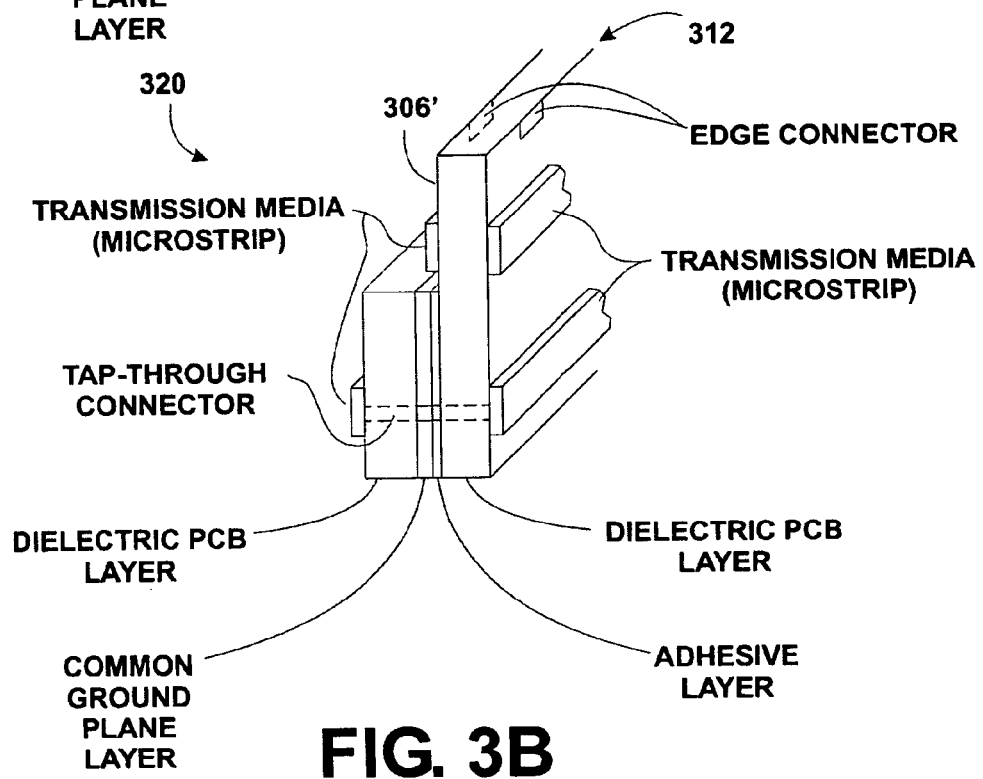
FIG. 3B is a perspective view of an alternate conceptual design for a double-sided, edge-mounted stripline signal processing module.

FIG. 3B is a perspective view of an alternate conceptual design for a double-sided, edge-mounted stripline signal processing module 320. This module is similar to the module 300 described with reference to FIG. 3A except that the interface edge 312' is formed from only a single side 306' of the double-sided PC board. The interface ports may located on both faces of the PC board 306' as shown in FIG.

3B, or they may all be located on one face, in accordance with the manufacturer's design preference.

Figure 4:
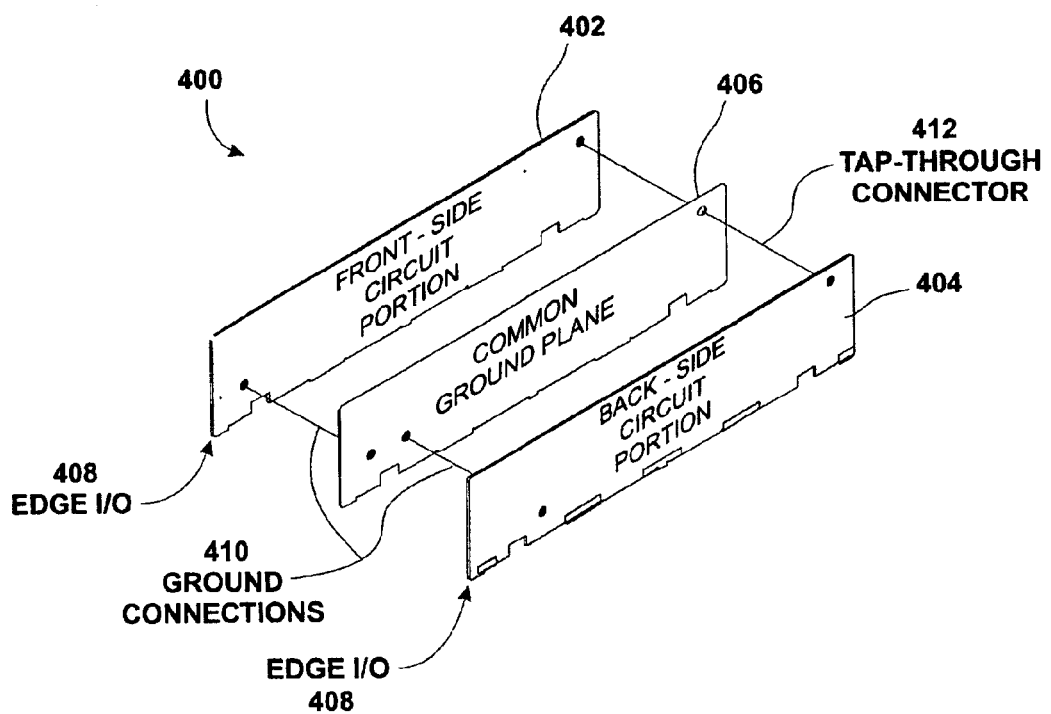
FIG. 4 is a perspective exploded view of a double-sided, edge-mounted stripline signal processing module.

FIG. 4 is a perspective exploded view of a double-sided, edge-mounted stripline signal processing module 400. The previously-described elements including a front-side circuit portion 402, a back-side circuit portion 404, a ground plane 406, edge input and output ports 408, ground connections 410, and a tap-through connector 412 passing through but electrically isolated from the common ground plane 406 are shown in an exploded manner for clarity.

Figure 5A:
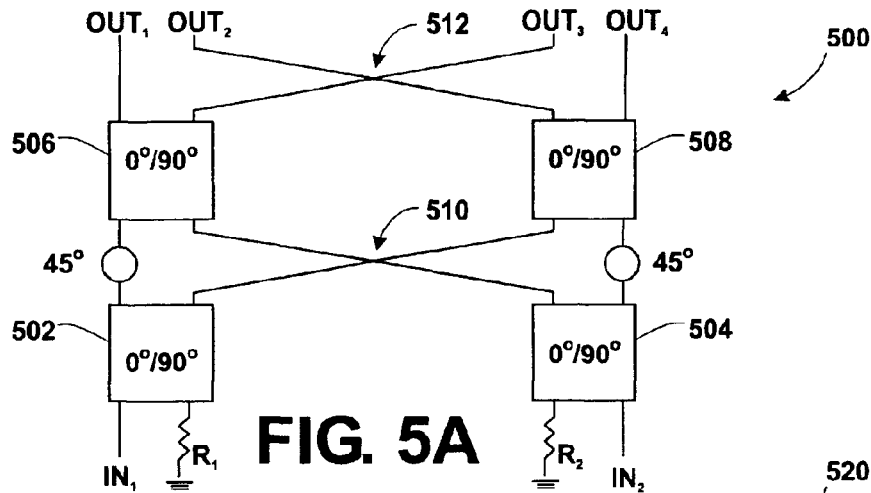
FIG. 5A is a functional block diagram of a two-by-four beam forming network for use in a single-beam vertical electrical downtilt antenna system.

FIG. 5A is a functional block diagram of a two-by-four beam forming network 500 that may be used to implement the single-beam vertical electrical downtilt network 206 shown in FIG. 2. The functional block diagram is equivalent to a conventional four-by-four Butler matrix beam forming network with two of the inputs terminated into impedance load resistors $R_1$ and $R_2$. The elements 502 and 504 represent first stage two-by-two quadrature (as indicated by the "0/90°" designation) hybrid junction components. The elements 505 and 506 represent second stage two-by-two quadrature hybrid junction components, and the elements 510 and 512 represent crossovers. There are four output ports ($out_1$–$out_4$) but two input ports ($in_1$ and $in_2$) because the unnecessary additional inputs are shunted to ground through impedance matching resistors R1 and R2, as shown in the schematic diagram.

Figure 5B:
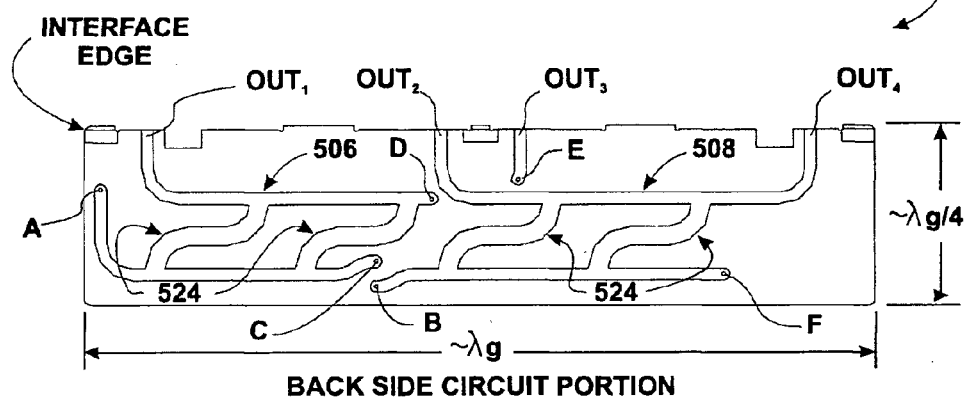
FIG. 5B is a circuit board layout diagram of the back side portion of a double-sided, edge-mounted stripline signal processing module implementing the two-by-four beam forming network shown in FIG. 5A.
Figure 5C:
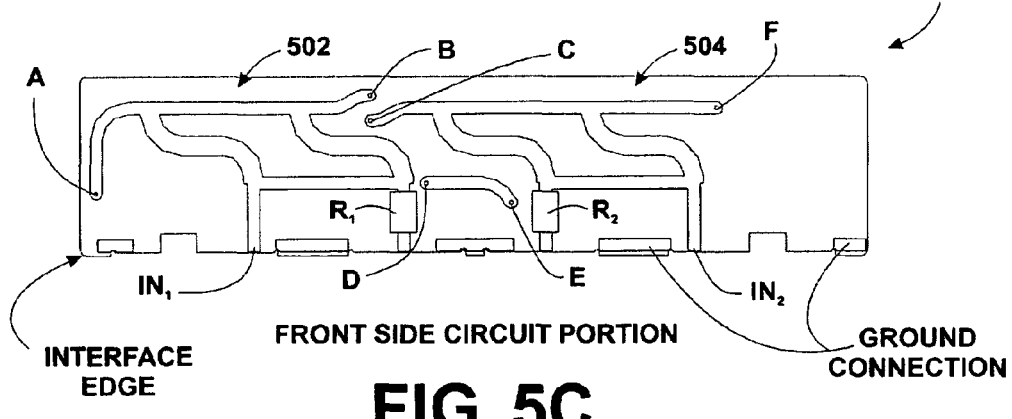
FIG. 5C is a circuit board layout diagram of the front side portion of the two-by-four beam forming module shown in FIG. 6A.

FIG. 5B is a circuit board layout diagram of the back side circuit portion of a double-sided, edge-mounted, stripline signal processing module 520 for implementing the two-by-four beam forming network 500 shown in FIG. 5A. The second stage hybrid junction 506 is implemented with sinuous trace elements 522, and the second stage hybrid junction 508 is implemented with similar sinuous trace elements 524, to reduce the linear board length running away from the interface 526. FIG. 5C shows the circuit board layout diagram of the front side circuit portion of the board 530, which carries the first stage hybrid junctions 502 and 504 having similar sinuous trace elements. The commonly labeled tap points (A, B, C, etc.) indicate the locations of tap-through connectors connecting the front and back side circuit portions, and the input and output ports are labeled. The front and back side portions are brought together with the interface edges aligned in a double-sided, edge-mounted configuration. In addition, FIGS. 5B and 5C are laid out with respect to each other to show the circuit diagrams in a butterfly manner.

The approximate board dimensions of $\lambda_g$ along the interface edge 526 and $\lambda_g/4$ in the direction running away from the interface edge are show on FIGS. 5B and 5C. For a PC board manufactured from PTFE Teflon® dielectric material exhibiting a dielectric constant equal to 2.2 ($\in_r$=2.2), which results in stripline transmission media segments exposed to the PC board on one side and exposed to air on the other side exhibiting an effective dielectric constant of 1.85 ($\in_{reff}$= 1.85). This circuit board design may be implemented for a carrier frequency of 1.92 GHz on a double-sided, edge-mounted PC board module that is approximately $\lambda_g$ (i.e., 4.52 inches or 11.48) cm along the interface edge, and is $\lambda_g/4$ (i.e., 1.13 inches or 2.27 cm) in the direction extending away from the interface edge.

Figure 6A:
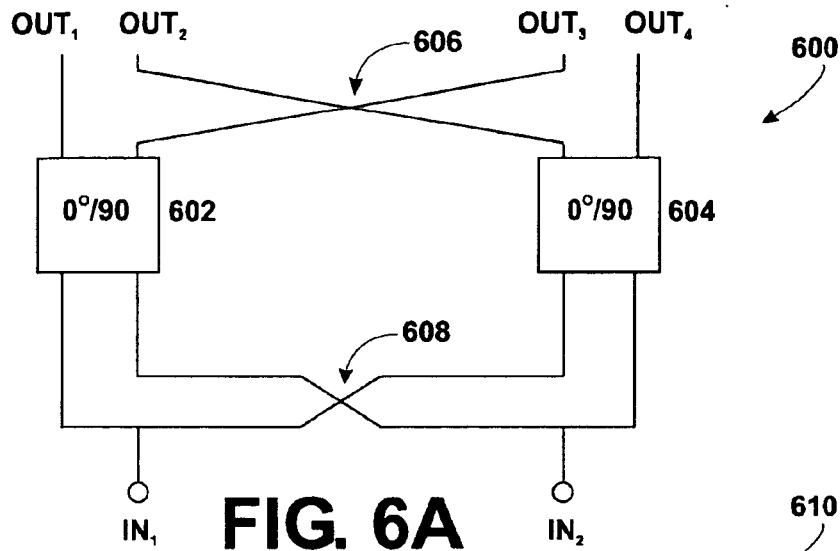
FIG. 6A is a functional block diagram of an alternate embodiment of a two-by-four beam forming network for use in a single-beam vertical electrical downtilt antenna system.
Figure 6B:
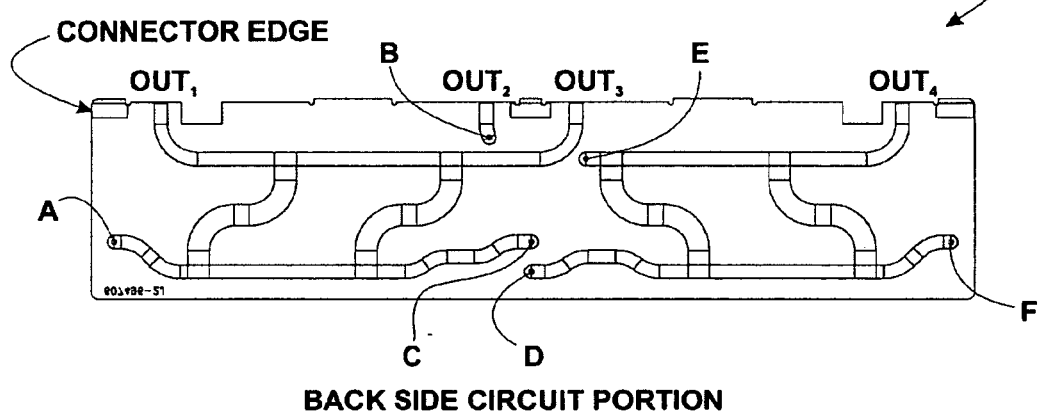
FIG. 6B is a circuit board layout diagram of the back side portion of a double-sided, edge-mounted stripline signal processing module implementing the two-by-four beam forming network shown in FIG. 6A.
Figure 6C:
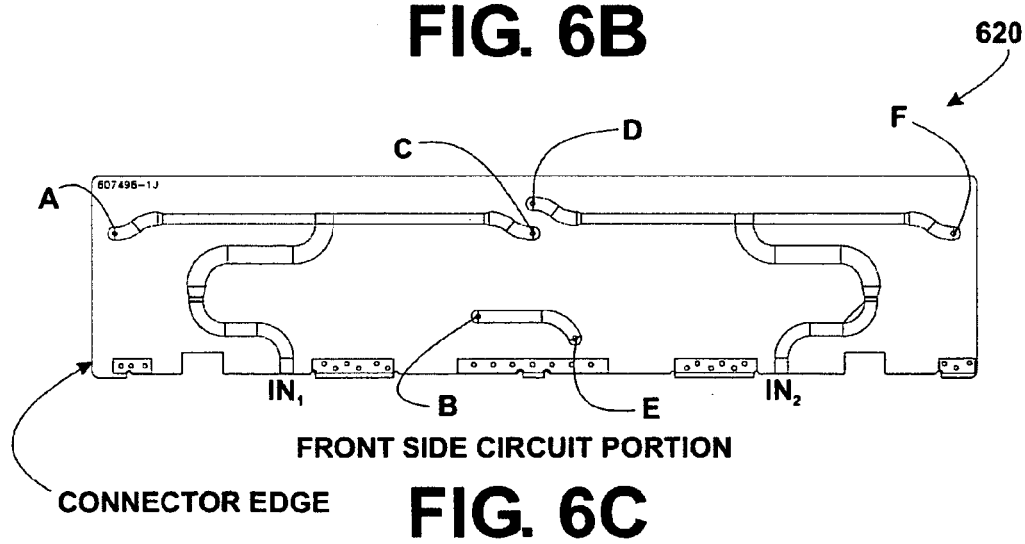
FIG. 6C is a circuit board layout diagram of the front side portion of the two-by-four beam forming network filter module shown in FIG. 6A.

FIG. 6A is a functional block diagram of a two-by-four beam forming circuit 600, which includes two-by-two quadrature hybrid junctions 602 and 604, along with crossovers 606 and 608. FIG. 6B is a circuit board layout diagram of a back side portion of a double-sided, edge-mounted stripline signal processing module 610 implementing the two-by-four beam forming circuit shown in FIG. 6A, and FIG. 6C is a circuit board layout diagram of the front side portion 620 of that circuit. The beam forming circuit 600 can be implemented on a PC board module constructed from the same materials and having the same dimensions as the two-by-four beam forming network 500 described above with reference to FIGS. 5A–C. In other words, these circuits may be manufactured in an identical manner except that the stripline circuitry is slightly different, as appropriate to implement a different circuit.

Figure 7A:
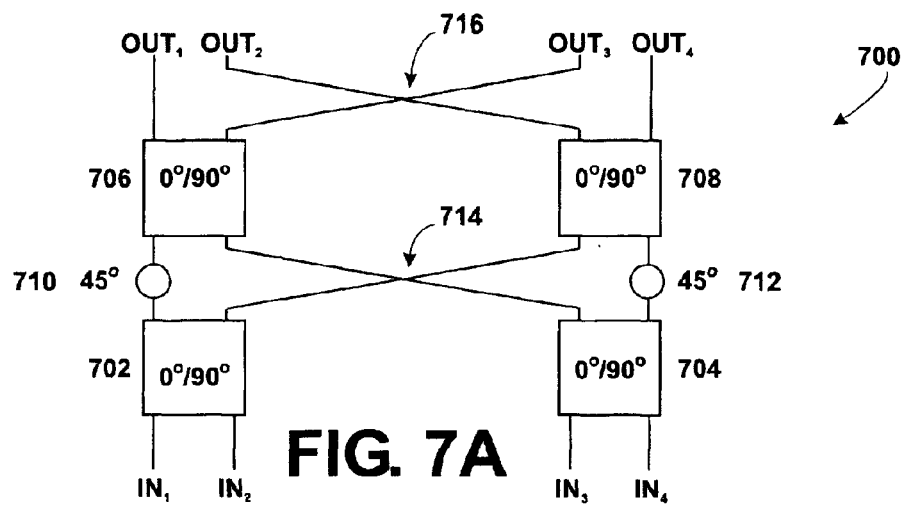
FIG. 7A is a functional block diagram of a four-by-four Butler matrix module.
Figure 7B:
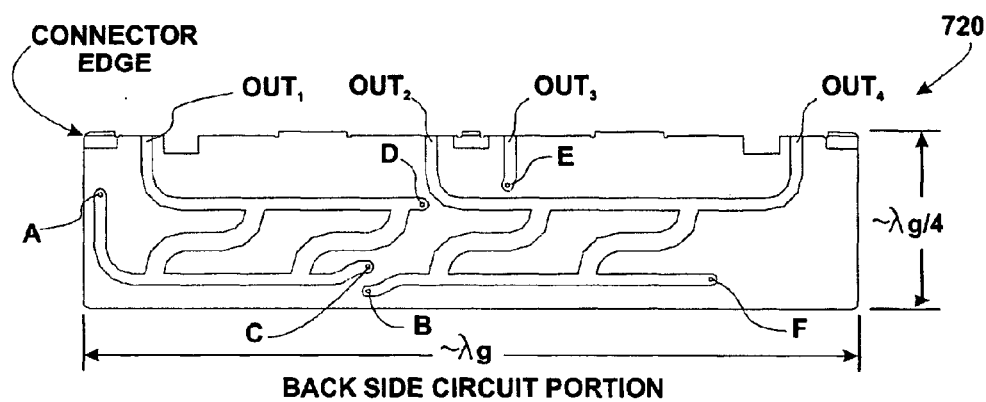
FIG. 7B is a circuit board layout diagram of the back side portion of a double-sided, edge-mounted stripline signal processing module implementing the four-by-four Butler matrix circuit shown in FIG. 7A.
Figure 7C:
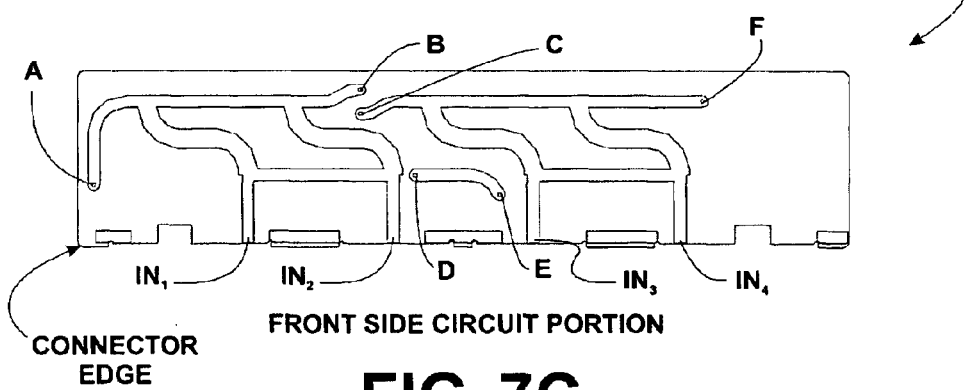
FIG. 7C is a circuit board layout diagram of the front side portion of the four-by-four Butler matrix module shown in FIG. 7A.

FIG. 7A is a functional block diagram of a four-by-four Butler matrix beam forming module 700, which includes first stage two-by-two quadrature hybrid junctions 702 and 704, second stage two-by-two quadrature hybrid junctions 706 and 708, phase shifters 710 and 712, and crossovers 714 and 716. FIG. 7B is a circuit board layout diagram of the back side of a double-sided, edge-mounted stripline signal processing module 720 implementing the four-by-four Butler matrix shown in FIG. 7A, and FIG. 7C is the circuit board layout diagram of the back side 722 of that circuit. The four-by-four Butler matrix 700 can be implemented on a PC board module constructed from the same materials and having the same dimensions as the two-by-four beam forming networks 500 and 600 described above with reference to FIGS. 5A–C and FIGS. 6A–C, respectively.

Figure 8A:
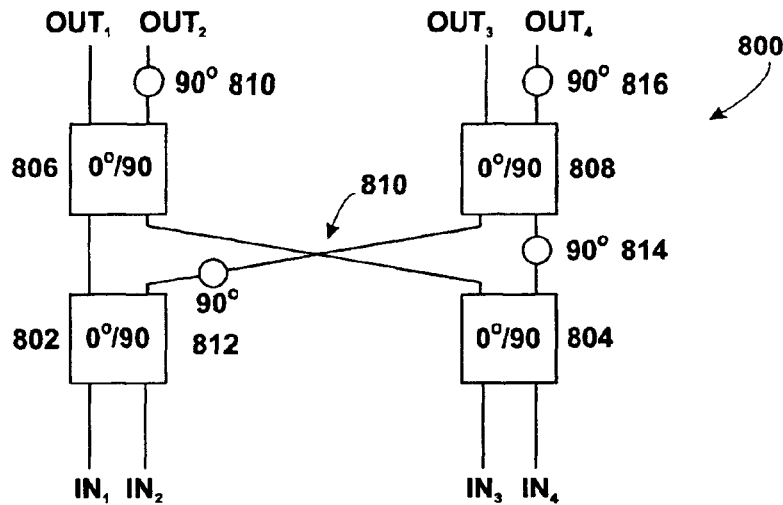
FIG. 8A is a functional block diagram of a monopulse comparator module.
Figure 8B:
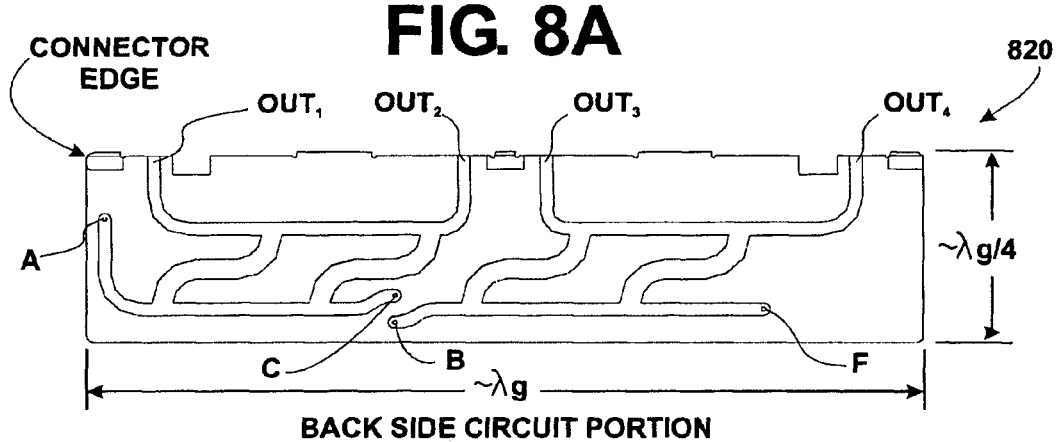
FIG. 8B is a circuit board layout diagram of the back side portion of a double-sided, edge-mounted analog signal processing module implementing the monopulse comparator module shown in FIG. 8A.
Figure 8C:
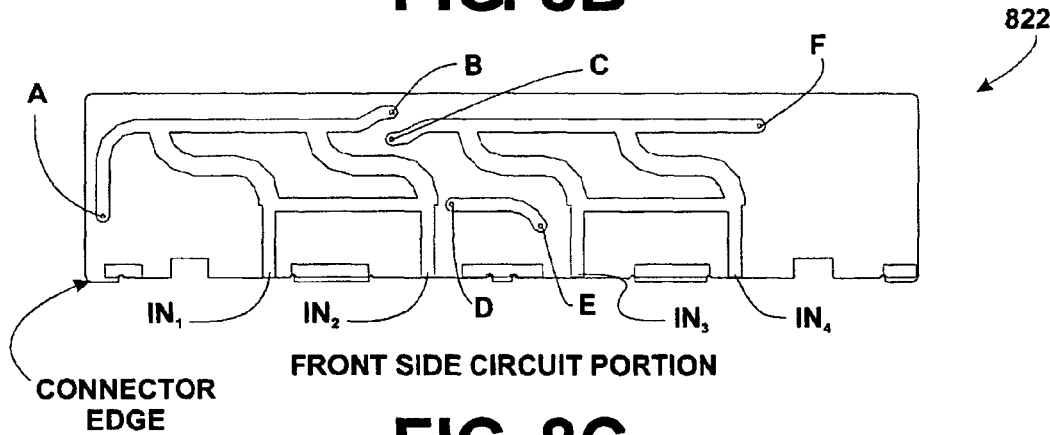
FIG. 8C is a circuit board layout diagram of the front side portion of the monopulse comparator module shown in FIG. 8A.

FIG. 8A is a functional block diagram of a four-by-four monopulse comparator module 800, which includes first stage two-by-two quadrature hybrid junctions 802 and 804, second stage quadrature hybrid junctions 806 and 808, and crossovers 810 and 812. The hybrid junctions 802 and 804 are used in combination with phase offset shifters 812 and 814 to effectively to produce the functional equivalent characteristics of a two-by-two "magic-T" (0°/180°) hybrid junction. It is well known to those familiar with the art that, for example, a "rat-race" 0°/1800 hybrid junction can be used in place of the hybrid junction 802 and phase offset shifter 812. FIG. 8B is a circuit board layout diagram of the back side portion of a double-sided, edge-mounted stripline signal processing module 820 implementing the four-by-four monopulse comparator circuit shown in FIG. 8A, and FIG. 8C is the circuit board layout diagram of the front side 822 portion of that circuit. The four-by-four monopulse comparator circuit 800 can be implemented on a PC board module constructed from the same materials and having the same dimensions as the two-by-four beam forming networks 500 and 600 described above with reference to FIGS. 5A–C and FIGS. 6A–C, respectively, and the four-by-four Butler matrix 700 described above with reference to FIGS. 7A–C.

Figure 9:
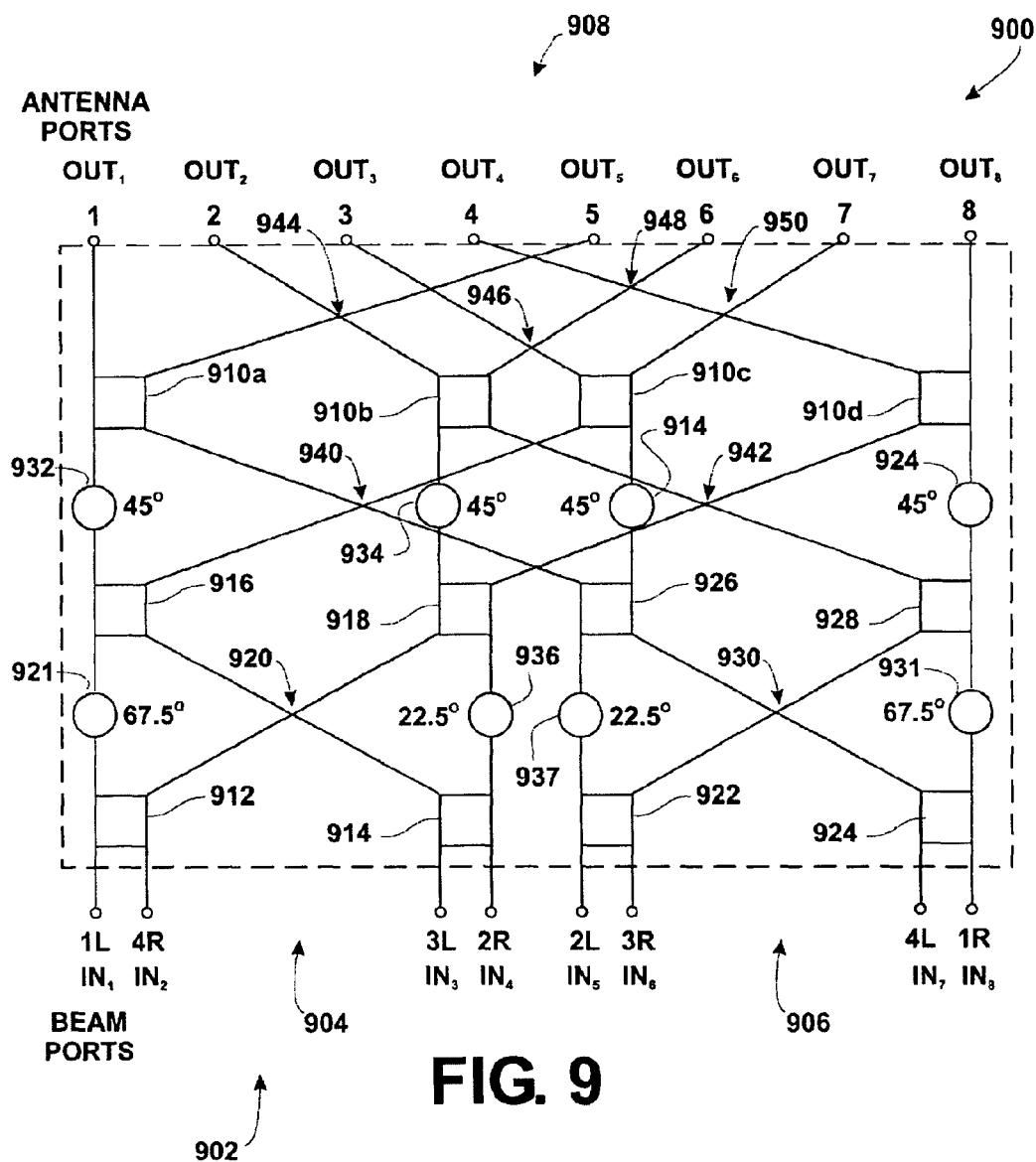
FIG. 9 is a functional block diagram of an eight-by-eight Butler matrix module.

FIG. 9 is a functional block diagram of an eight-by-eight Butler matrix module 900, which includes a first stage 902 including a first four-by-four "quasi-Butler" matrix 904 and a second four-by-four "quasi-Butler" matrix 906. The circuit 900 also includes a second stage 908 including four hybrid junctions 910a-d. The first "quasi-Butler" matrix 904 includes first stage quadrature hybrid junctions 912 and 914, second stage quadrature hybrid junctions 916 and 918, a crossover 920, and a 67.5° phase offset shifter 921, and a 22.5° phase offset shifter 936. Similarly, the second "quasi-Butler" matrix 906 includes first stage quadrature hybrid junctions 922 and 924, second stage quadrature hybrid junctions 926 and 928, a crossover 930, and a 67.5° phase offset shifter 931, and a 22.5° phase offset shifter 937. Additional crossovers 940 and 942 and 45° phase shifters 932,934, 935, and 924 connect the first stage 902 to the second stage 908, with further crossovers 944, 946, 948, and 950 connecting the hybrid junctions of the second stage 908 to the output ports.

Figure 10A:
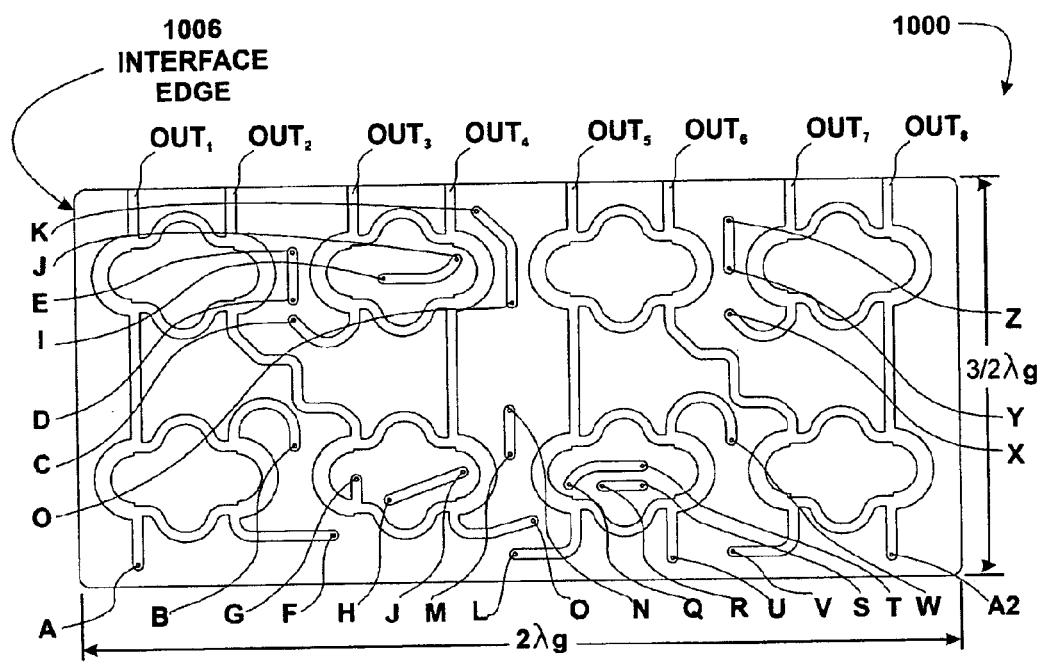
FIG. 10A is a circuit board layout diagram of the back side portion of a double-sided, edge-mounted analog signal processing module implementing the eight-by-eight Butler matrix circuit shown in FIG. 9.
Figure 10B:
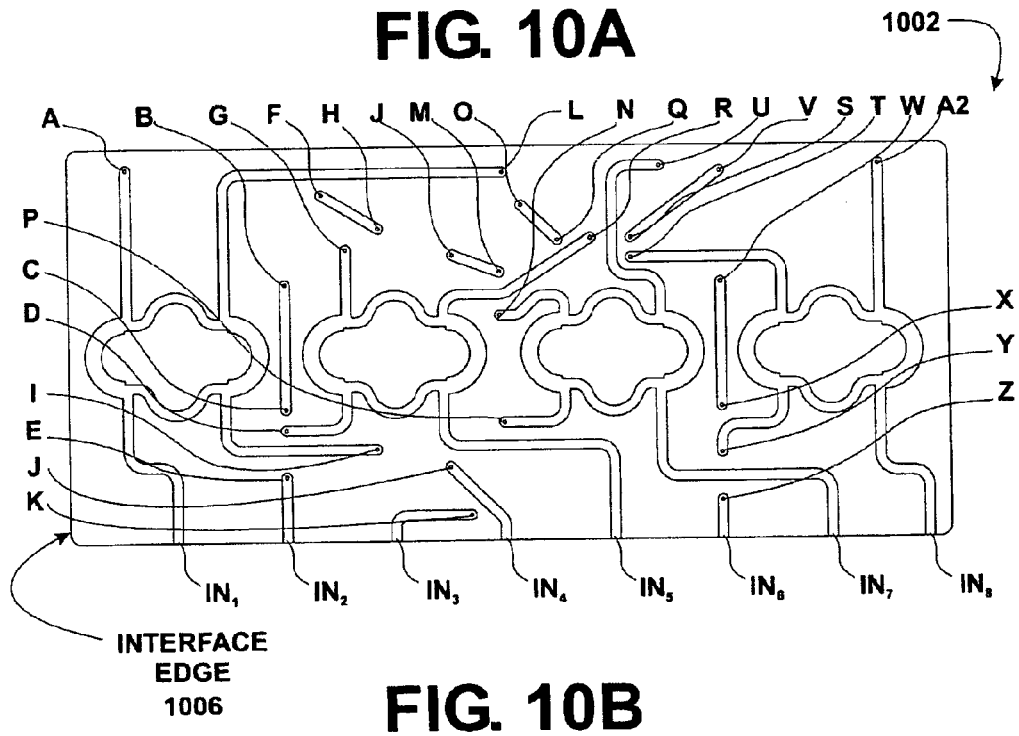
FIG. 10B is a circuit board layout diagram of the front side portion of the eight-by-eight Butler matrix module shown in FIG. 9.

FIG. 10A is a circuit board layout diagram of the back side circuit portion 1000 of a double-sided, edge-mounted stripline signal processing module implementing the eight-by-eight Butler matrix circuit shown in FIG. 9, and FIG. 10B shows the front side circuit portion of that module. As in the previous double-sided circuit board illustrations, FIGS. 10A and 10B are illustrated in a butterfly manner with common designation (e.g., A, B, C, etc.) identifying the tap-through connectors, which typically participate in the implementation of the crossovers. FIGS. 10A–10B also illustrate the use of sinuous trace legs, as exemplified by the sinuous trace leg 1004, to reduce the board size in the direction extending away from the interface edge 1006. The planar board dimensions in multiples of $\lambda_g$ are also shown.

Figure 11A:
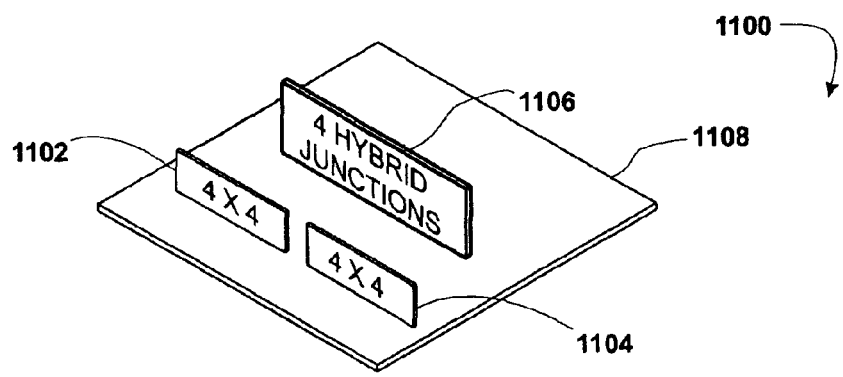
FIG. 11A is a conceptual diagram of an edge-mounted modular stripline signal processing network for implementing an eight-by-eight Butler matrix from two four-by-four Butler matrix modules and a third module implementing four hybrid junctions that are each daughter boards edge mounted to a mother board.
Figure 11B:
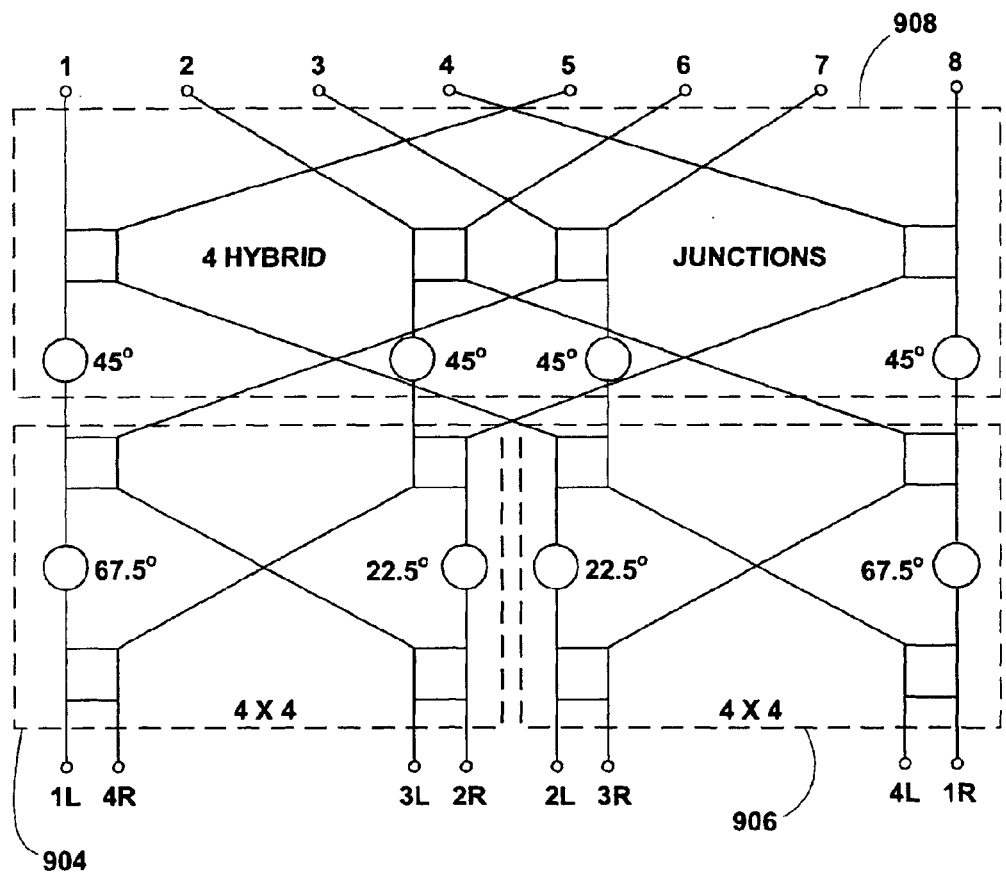
FIG. 11B is a functional block diagram of an eight-by-eight Butler matrix illustrating the division of signal processing functions among the modules shown in FIG. 11A.

FIG. 11A is a conceptual diagram of an edge-mounted modular stripline signal processing network 1100 for implementing an eight-by-eight Butler matrix from two four-by-four "quasi-Butler" matrix modules 1102 and 1104 and a third module 1106 implementing four hybrid junctions edge connected to a motherboard 1108. Of course, one or more of these modules, or additional functionality, could be implemented on the motherboard 1108. FIG. 11B is a functional block diagram of an eight-by-eight Butler matrix similar to the diagram of FIG. 9, but in this example illustrating how the signal processing functions are divided among the modules shown in FIG. 11A. Specifically, the first four-by-four "quasi-Butler" matrix 904 is implemented on the first module 1102, the second four-by-four "quasi-Butler" matrix 906 is implemented on the second module 1104, and the four hybrid junctions of the second stage 908 are implemented on the first module 1106. These three modules are edge-mounted to and interconnected through the motherboard 1108 to provide a multi-module alternative for implementing the same eight-by-eight Butler matrix described with reference to FIGS. 10A–10C, which his implemented as a single double-sided, edge-mounted planar module.

Figure 12:
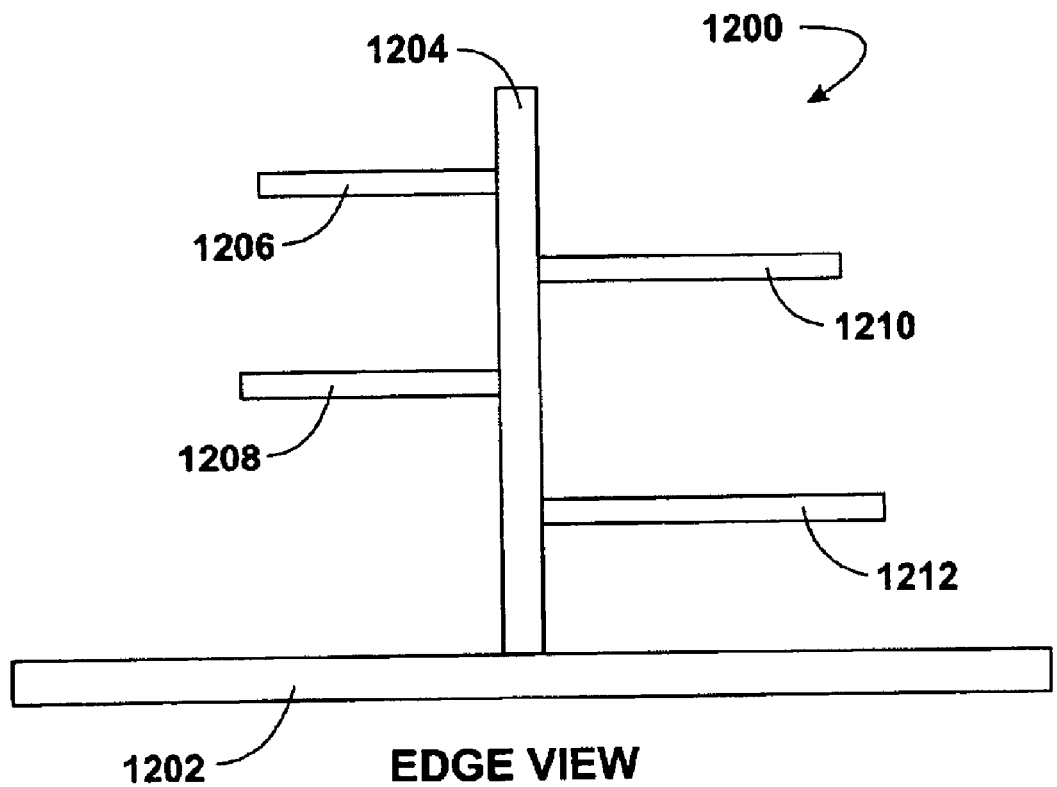
FIG. 12 is a conceptual diagram of tree-type stripline signal processing network comprising a system of daughter boards edge mounted to mother boards.

FIG. 12 is a conceptual diagram of tree-type stripline signal processing network 1200 comprising a "tree" type system of daughter boards 1204, 1206, 1208, 1210, and 1212 edge mounted to a mother board 1202. That is, the modular signal processing architecture illustrated at a relatively simple level in FIGS. 11A–11B may be extended in a straightforward manner to create more complex processing systems to drive higher-order networks, such as a 64-by-64 Butler matrix, 128-by-128 Butler matrix, a multi-level high-power hybrid matrix amplifier, and so forth. These stripline signal processing engines, in turn, provide the signal processing infrastructure for complex systems, such as multi-beam Doppler radars, multi-beam missile tracking and defense systems, multi-beam satellite reconnaissance systems, and many other devices employing the modular signal processing architecture illustrated by the exemplary embodiments of the invention described above.

Figure 13:
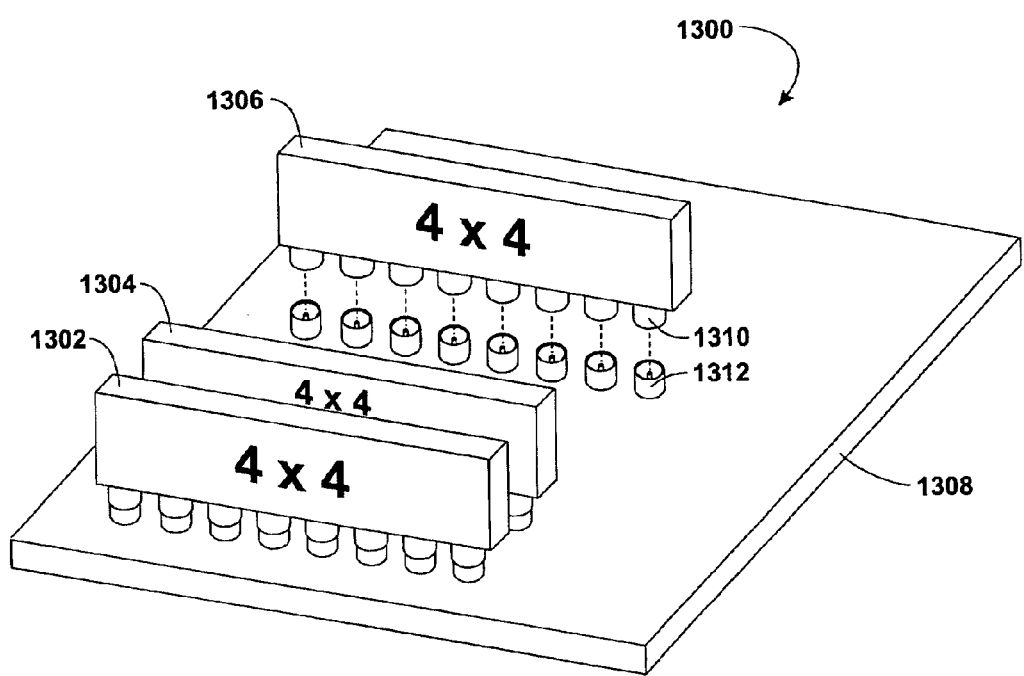
FIG. 13 illustrates a modular stripline signal processing network including daughter boards edge mounted to a mother board using separable blind-mate coaxial connectors.

FIG. 13 illustrates a modular stripline signal processing network 1300 including daughter boards 1302, 1304, and 1306 edge mounted to mother board 1308 using separable blind-mate coaxial connectors exemplified by the connector 1310, 1320. Using separable connectors 1310 and 1312 to connect the boards together facilitates installation and removal of the boards for modular construction and maintenance purposes. It will be appreciated that additional support structures, such as side rail supports and board lock-down mechanisms, as are well know in the art, may be employed to increase the physical integrity of the constructed unit.

Figure 14:
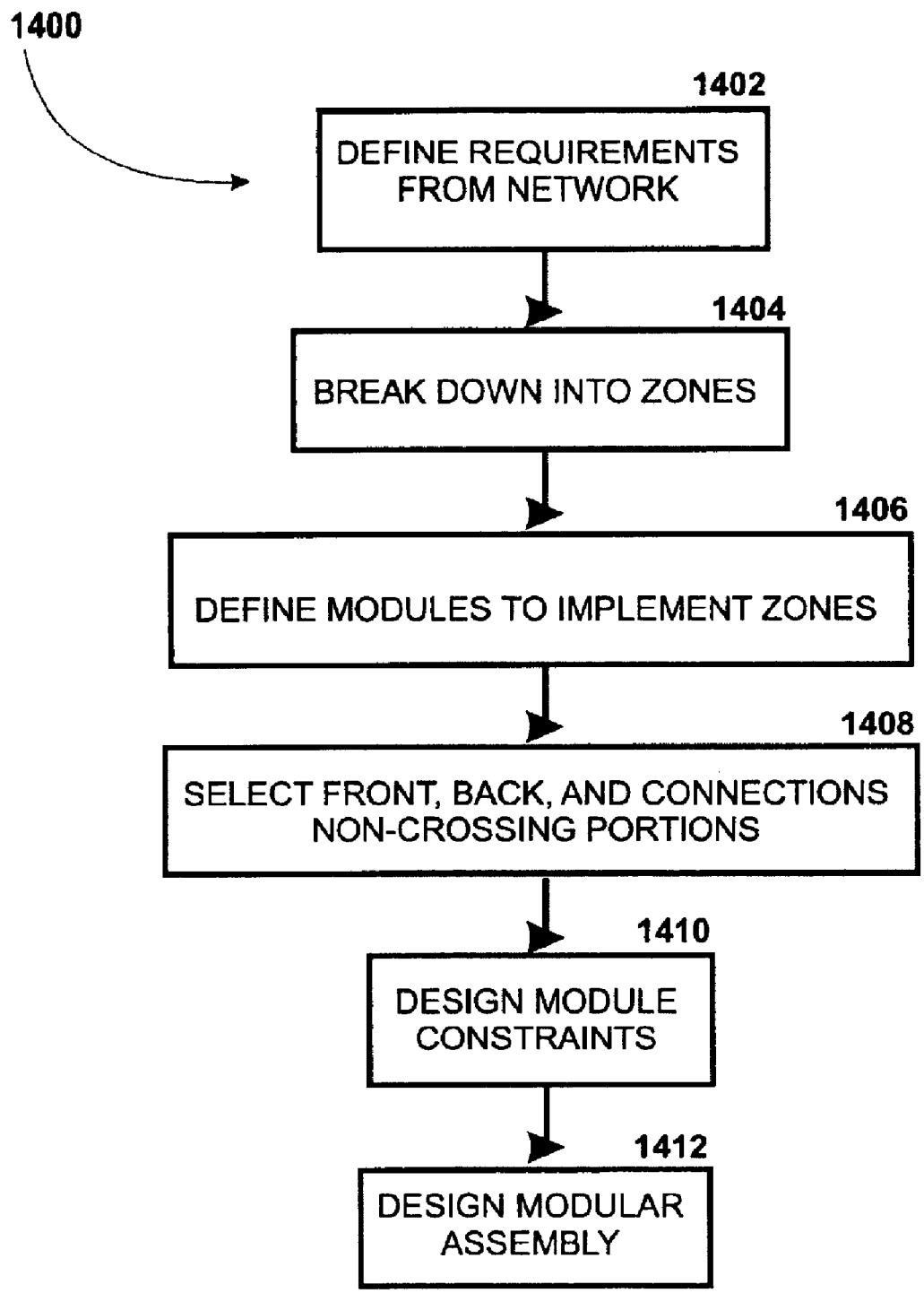
FIG. 14 is a logic flow diagram illustrating a process for designing a modular stripline signal processing network.

FIG. 14 is a logic flow diagram illustrating a process 1400 for designing a modular stripline signal processing network.

The following description will refer to the four-board structure implementing the eight-by-eight Butler matrix shown in FIGS. 11A–B as a simple but illustrative example of the network design process. In step 1402, the circuit designer defines the requirements of the network, such as an eight-by-eight Butler matrix for the example shown in FIGS. 11A–B. Step 1402 is followed by step 1404, in which the circuit designer breaks down the overall network into zones. In the eight-by-eight Butler matrix example shown in FIGS. 11A–B, these zones include the first four-by-four "quasi-Butler" matrix 904 as a first zone, the second four-by-four "quasi-Butler" matrix 906 as a second zone, and the four hybrid junctions 908 as a third zone. Step 1404 is followed by step 1406, in which the circuit designer defines modules to implement the zones that are properly sized for the desired module sizes. Step 1406 is followed by step 1408, in which the circuit designer designs front and back circuit portions, along with tap-through connections as appropriate, that overlay each other to implement the circuits in a double-sided manner, preferably with non-crossing circuit portions on each side of the board. Step 1408 is followed by step 1410, in which the circuit designer designs the modules to implement the required functionality while meeting applicable module constraints.

This result of this process is illustrated by the modular board design shown in FIGS. 5A–C, 6A–C, 7A–C, 8A–C, and 10A–B, in which each module is laid out in a double-sided, edge-connected format employing non-crossing circuit portions on each side of the board and tap-through connections to implement crossovers. Step 1410 is followed by step 1412, in which the circuit designer designs the modular assembly. In the eight-by-eight Butler matrix for the example shown in FIGS. 11A–B, this corresponds to edge connecting the modules 1102, 1104 and 1106 to the mother board 1108 to create a complete modular design. It will be appreciated that the four-board modular design of the eight-by-eight Butler matrix shown in FIGS. 11A–B is but one relatively simple example of a design technique enabled by the present invention that may be used design and construct a wide range of stripline signal processing machines within the class of double-sided, edge-mounted printed circuit (PC) modules and the associated modular network architecture.

The stripline modules described above with reference to FIGS. 3A–10B are of the type commonly referred to as "microstrip," in which the stripline transmission media segments are exposed to a dielectric material on one side and air on the other. It should be understood that any of the stripline circuits described in this specification may alternatively be configured as tri-plate stripline modules, in which the stripline transmission media segments are exposed to a dielectric material on both sides. This is typically accomplished by adding dielectric covers with outer ground plates over the air-exposed stripline circuits of the microstrip configurations. The result is a multi-layer double-sided stripline module including a first outer ground plane layer, followed by a dielectric layer, followed by a first stripline circuit layer, followed by a dielectric layer, followed by a center ground plane layer, followed by a dielectric layer, followed by a second stripline circuit layer, followed by a dielectric layer, followed by a second outer ground plane layer.

Figure 15A:
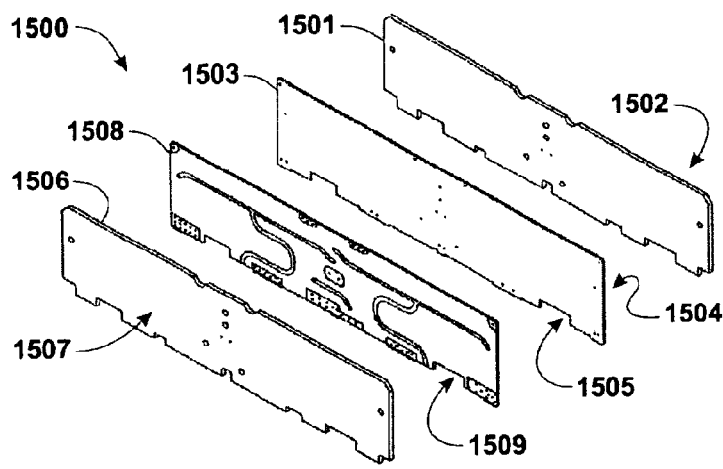
FIG. 15A is a perspective exploded view of a tri-plate stripline module for a modular stripline signal processing network.

For example, FIG. 15A is a perspective exploded view of a tri-plate stripline module 1500 for implementing a two-by-four beam forming network similar to the circuit shown in FIGS. 6A–C. To create the tri-plate stripline structure, a first dielectric cover 1501 with an outer ground plane 1502 has been added over a first microstrip circuit board 1503, which typically includes a dielectric PC board with a stripline circuit 1504 (shown in FIG. 15C) on one side and a ground plane 1505 adhered to the other side. In addition, a second dielectric cover 1506 with an outer ground plane 1507 has been added over a second microstrip circuit board 1508, which typically includes a dielectric PC board carrying a stripline circuit 1509. That is, the tri-plate stripline module 1500 contains an equivalent of the two-by-four beam forming network similar to the circuit shown in FIG. 6A–B (represented by elements 1503 and 1508 in FIG. 15A) with additional dielectric covers 1501 and 1506, which each have outer ground planes 1502 and 1507, respectively. The additional dielectric cover with an outer ground planes shield the stripline circuits from radiating losses and interference. FIG. 15C shows a side view of layer 1503 carrying the first stripline circuit 1504, FIG. 15C shows a side view of layer 1508 carrying the second stripline circuit 1509, FIG. 15B shows an assembled perspective view of the tri-plate stripline module 1500.

Figure 15B:
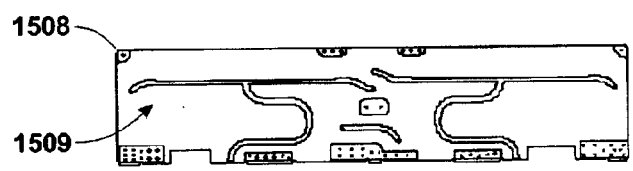
FIG. 15B is a side view of a first stripline circuit of the tri-plate stripline module of FIG. 15A.
Figure 15C:
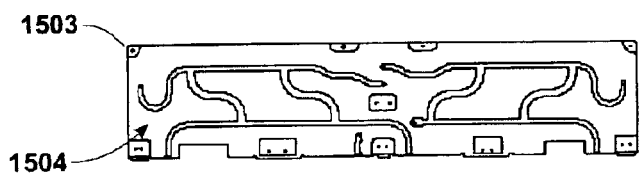
FIG. 15C is a side view of a second stripline circuit of the tri-plate stripline module of FIG. 15A.
Figure 15D:
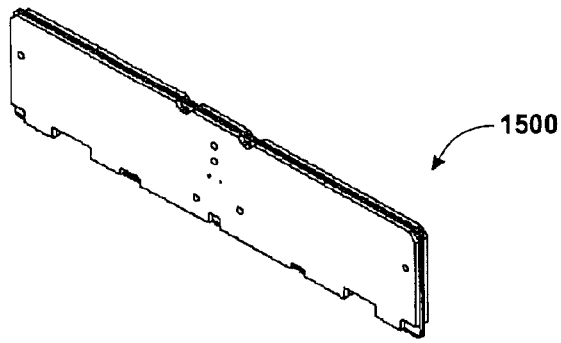
FIG. 15D is an assembled perspective view of the tri-plate stripline of FIG. 15A.

In this particular module, the first stripline circuit 1504 shown in FIG. 15C is similar to the microstrip circuit 610 of the two-by-four beam forming network similar to the circuit shown in FIG. 6B except that the lengths and widths of the stripline segments are adjusted to account for the different dielectric exposed to the stripline segments (i.e., air on one side of the stripline segments and a dielectric substrate on the other side of the stripline segments in the embodiment of FIG. 6A–C, versus a dielectric material on both sides of the stripline segments in the embodiment of FIGS. 15A–D). Similarly, the second stripline circuit 1509 shown in FIG. 15B is similar to the microstrip circuit 612 of the two-by-four beam forming network shown in FIG. 6C except that the lengths and widths of the stripline segments are adjusted to account for the different dielectric exposed to the stripline segments. Those skilled in the art will understand how to adjust the lengths and widths of the stripline segments to account for this change in the effective dielectric constant for the segments. Although this particular module implements a two-by-four beam forming network, any of the double-sided stripline circuits described in this specification may be implemented in a similar tri-plate stripline configuration.

Figure 16A:
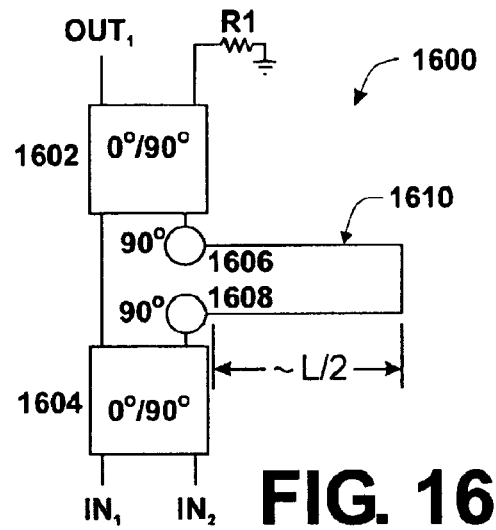
FIG. 16A is a functional block diagram of a diplexer filter module.
Figure 16B:
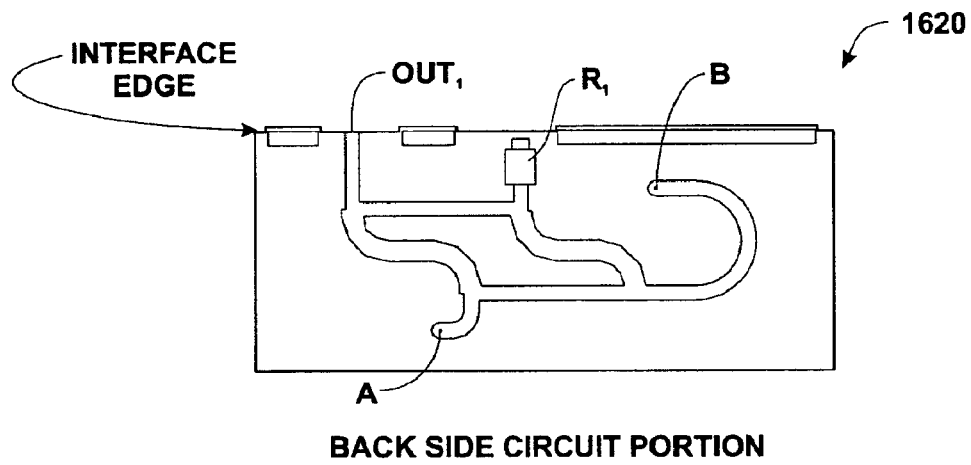
FIG. 16B is a circuit board layout diagram of the back side portion of a double-sided, edge-mounted analog signal processing module implementing the diplexer filter module shown in FIG. 8A.
Figure 16C:
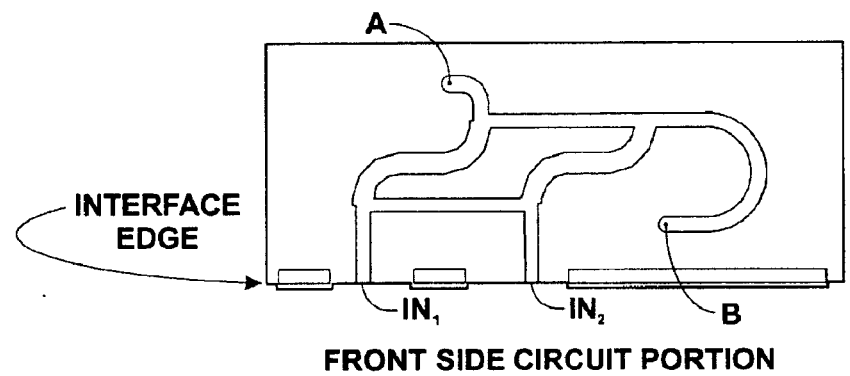
FIG. 16C is a circuit board layout diagram of the front side portion of the diplexer filter module shown in FIG. 16A.

FIG. 16A is a functional block diagram of a two-by-one diplexer filter circuit 1600, which includes two-by-two quadrature hybrid junctions 1602 and 1604, along with phase offset shifters 1606 and 1608 and a length of transmission line 1610 that is producing an additional signal delay in one signal path. FIG. 6B is a circuit board layout diagram of a back side portion of a double-sided, edge-mounted stripline signal processing module 1620 implementing the two-by-one diplex filter circuit shown in FIG. 16A, and FIG. 16C is a circuit board layout diagram of the front side portion 1622 of that circuit. The diplexer filter circuit 1600 can be implemented on a PC board module constructed from the same materials and having smaller dimensions as the two-by-four beam forming network 500 described above with reference to FIGS. 5A–C. In other words, these circuits may be manufactured in an identical manner except that the stripline circuitry is slightly different, as appropriate to implement a different circuit.

In view of the foregoing, it will be appreciated that present invention provides significant improvements in stripline signal processing network design. It should be understood that the foregoing relates only to the exemplary embodiments of the present invention, and that numerous changes may be made therein without departing from the spirit and scope of the invention as defined by the following claims.

The invention claimed is:

1. A stripline signal processing module comprising:
a first planar dielectric substrate defining an edge;
a second planar dielectric substrate defining an edge;
a ground plane;
the first dielectric substrate, the second dielectric substrate, and the ground plane adhered together in an overlaying configuration with the ground plane located between the first and second dielectric substrates and the edges aligned to form an interface edge;
a first stripline circuit exposed on one side to the first dielectric substrate and to air on an opposing side;
a second stripline circuit exposed on one side to the second dielectric substrate and to a air on an opposing side;
one or more input ports located at the interface edge and electrically connected to the first or second stripline circuits;
one or more output ports located at the interface edge and electrically connected to the first or second stripline circuits; and
the first and second stripline circuits configured to receive propagating signals at the input ports, perform a signal processing operation on the received propagating signals, and deliver processed signals to the output ports.

2. The stripline signal processing module of claim 1, wherein:
the first dielectric substrate, the second dielectric substrate, and the ground plane are approximately coextensive in their planar dimensions; and
the first and second stripline circuits comprise stripline exposed to the dielectric substrate on one side and exposed to air or a dielectric material on an opposing side.

3. The stripline signal processing module of claim 1, further comprising one or more electrical connections between the first and second stripline circuits.

4. The stripline signal processing module of claim 3, wherein the electrical connections between the first and second stripline circuits comprise tap-through connectors passing through and insulated from the ground plane.

5. The stripline signal processing module of claim 1, wherein the first and second stripline circuits are non-crossing.

6. The stripline signal processing module of claim 4, wherein:
the first stripline circuit defines a first stage orthogonal beam forming network;
the second stripline circuit defines a second stage orthogonal beam forming network; and
the electrical connections between the first and second stripline circuits participate in the formation of crossovers connecting the first and second stage orthogonal beam forming network into a multi-stage orthogonal beam forming network.

7. The stripline signal processing module of claim 1, wherein the first and second stripline circuits comprise a signal processing circuit selected from the group consisting of:
a two-by-four beam steering circuit;
a diplexer filter circuit comprising at least three ports;
a four-by-four Butler matrix circuit;
an eight-by-eight Butler matrix circuit; and
a monopulse comparator circuit.

8. The stripline signal processing module of claim 3, wherein:
the first and second stripline circuits define non-crossing portions of a hybrid junction circuit; and
the electrical connections between the first and second stripline circuits participate in the implementation of one or more crossovers associated with the hybrid junction circuit.

9. The stripline signal processing module of claim 1, wherein the first and second stripline circuits define a beam forming network.

10. The stripline signal processing module of claim 1, wherein the first or second stripline circuits comprises one or more sinuous trace legs configured to exhibit a desired phase and impedance characteristic while reducing the displacement of the trace in a selected dimension.

11. The stripline signal processing module of claim 7, wherein the planar dimensions of the first dielectric substrate, the second dielectric substrate, and the ground plane are less than one and one-half times the wavelength of the carrier frequency in the stripline.

12. The stripline signal processing module of claim 1, wherein:
the first and second stripline circuits comprise a four-by-four Butler matrix circuit configured for a carrier frequency; and
the planar dimensions of the first dielectric substrate, the second dielectric substrate, and the ground plane include:
a length in the direction of the interface edge that is less than one and one-half times the wavelength of the carrier frequency in the stripline, and
a width perpendicular to the interface edge that is less than one-half times the wavelength of the carrier frequency in the stripline.

13. The stripline signal processing module of claim 1, wherein:
the first and second stripline circuits comprise a four-by-four Butler matrix circuit configured for a carrier frequency; and
the planar dimensions of the first dielectric substrate, the second dielectric substrate, and the ground plane include:
a length in the direction of the interface edge that is approximately equal to the wavelength of the carrier frequency in the stripline, and
a width perpendicular to the interface edge that is approximately one-fourth times the wavelength of the carrier frequency in the stripline.

14. A stripline signal processing module comprising:
a first planar dielectric substrate defining an edge;
a second planar dielectric substrate that is approximately coextensive with the first planar dielectric substrate defining an edge;
a ground plane that is approximately coextensive with the first and second planar dielectric substrates;
the first dielectric substrate, the second dielectric substrate, and the ground plane adhered together in an overlaying configuration with the ground plane located between the first and second dielectric substrates and the edges aligned to form a interface edge;
a first stripline circuit exposed to the first dielectric substrate on one side and exposed to air on an opposing side;
a second stripline circuit exposed to the second dielectric substrate on one side and exposed to air on an opposing side;
a plurality of input interface ports located at the interface edge and electrically connected to the first stripline circuit;
a plurality of output interface ports located at the interface edge and electrically connected to the second stripline circuit;
one or more tap-through electrical connections between the first and second stripline circuits passing through and insulated from the ground plane electrical connections; and
the first and second stripline circuits configured to receive propagating signals at the input ports, perform a signal processing operation on the received propagating signals, and deliver processed signals to the output ports.

15. The stripline signal processing module of claim 14, wherein:
the first stripline circuit defines a first stage orthogonal beam forming network;
the second stripline circuit defines a second stage orthogonal beam forming network; and
the electrical connections between the first and second stripline circuits participate in the formation of crossovers connecting the first and second stage orthogonal beam forming network into a multi-stage orthogonal beam forming network.

16. The stripline signal processing module of claim 14, wherein the first or second stripline circuits comprises one or more sinuous trace legs configured to exhibit a desired phase and impedance characteristic while reducing the displacement of the trace in a selected dimension.

17. The stripline signal processing module of claim 1, wherein the first and second stripline circuits comprise a Butler matrix circuit configured for a carrier frequency.

18. The stripline signal processing module of claim 17, wherein the planar dimensions of the first dielectric substrate, the second dielectric substrate, end the ground plane are less than one and one-half times the wavelength of the carrier frequency in the stripline.

19. The stripline signal processing module of claim 14, wherein:
the first and second stripline circuits comprise a four-by-four Butler matrix circuit configured for a carrier frequency; and
the planar dimensions of the first dielectric substrate the second dielectric substrate, and the ground plane include:
a length in the direction of the interface edge that is less than one and one-half times the wavelength of the carrier frequency in the stripline, and
a width perpendicular to the interface edge that is less than one-half times the wavelength of the carrier frequency in the stripline.

20. The stripline signal processing module of claim 14, wherein:
the first and second stripline circuits comprise a four-by-four Butler matrix circuit configured for a carrier frequency; and
the planar dimensions of the first dielectric substrate, the second dielectric substrate, and the ground plane include:
a length in the direction of the interface edge that is approximately equal to the wavelength of the carrier frequency in the stripline, and
a width perpendicular to the interface edge that is approximately one-fourth times the wavelength of the carrier frequency in the stripline.

21. A stripline signal processing network comprising:
  a double-sided dielectric substrate board having first and second planar dielectric substrate boards located on opposing sides of a ground plane;
  an interface edge defined by at least one of the dielectric substrate boards;
  a first stripline circuit exposed on one side to the first dielectric substrate board and to air on an opposing side, the first stripline circuit further defining a first non-crossing portion of the stripline signal processing network;
  a second stripline circuit exposed on one side to the second dielectric substrate board and to air on an opposing side, the second stripline circuit further defining a second non-crossing portion of the stripline signal processing network;
  one or more electrical connections between the first and second stripline circuits participating in the formation of a crossover associated with the stripline signal processing network;
  one or more input ports end output ports located along the interface edge and electrically connected to the stripline circuits;
  the stripline signal processing network configured to receive propagating signals at the input ports, perform a signal processing operation on the received propagating signals, and deliver processed signals to the output ports and;
  each lower-order hybrid junction circuit comprises a Butler matrix circuit.

22. The stripline signal processing network of claim 21, wherein:
  the stripline circuits comprise stripline segments having sizes selected to exhibit desired phase and impedance characteristics; and
  the electrical connections between the first and second stripline circuits comprise tap-through connectors passing through and insulated from the ground plane.

23. A stripline signal processing network constructed from stripline carried on a dielectric substrate board comprising:
  a first portion of the stripline signal processing network exposed on one side to the first side of a double-sided dielectric substrate board and to air on an opposing side;
  a second portion of the stripline signal processing network circuit exposed on one side to a second side of the double-sided dielectric substrate board and to air on an opposing side;
  one or more electrical connections between the first and second portions of the stripline signal processing network;
  one or more input ports and output ports located along an interface edge defined by the dielectric substrate board; and
  the stripline signal processing network configured to receive propagating signals at the input ports and deliver processed signals to the output ports.

24. The stripline signal processing network of claim 23, wherein:
  the first and second portions of the network are non-crossing; and
  the electrical connections between the first and second portions of the network participate in the formation of a crossover associated with the network.

25. A modular stripline signal processing network comprising an interconnected set of network modules, wherein each network module comprises:
  a first stripline circuit exposed on one side to a first side of a double-sided dielectric substrate board and to air on an opposing side;
  a second stripline circuit exposed on one side to a second side of the double-sided dielectric substrate board and to air on an opposing side;
  one or more input ports and output ports located along an interface edge defined by the dielectric substrate board; and
  the network module configured to receive propagating signals at the input ports, perform a signal processing operation on the received propagating signals, and deliver processed signals to the output ports.

26. The modular stripline signal processing network of claim 25, wherein the interface ports for each network module are edge-connected to another network board through soldered connections.

27. The modular stripline signal processing network of claim 25, wherein the interface ports for each network module are configured for removable edge-connection to another network board through separable connections.

28. The modular stripline signal processing network of claim 27, wherein the separable connections comprise blind-mate coaxial connectors.

29. The modular stripline signal processing network of claim 27, wherein:
  each network module implements a lower-order hybrid junction circuit; and
  the interconnected set of network modules combines the network modules to implement a higher-order hybrid junction circuit.

30. The modular stripline signal processing network of claim 29, wherein:
  the higher-order hybrid junction circuit includes at least sixteen input ports and sixteen output ports.

31. The modular stripline signal processing network of claim 25, wherein, for each network module, the electrical connections between the first and second stripline circuits comprise tap-through connectors passing through and insulated from the ground plane.

32. The modular stripline signal processing network of claim 25, wherein, for network module:
  the first stripline circuit is non-crossing;
  the second stripline circuit is non-crossing; and
  the electrical connections between the first and second stripline circuits participate in the formation of a crossover associated with the signal processing network.

33. The modular stripline signal processing network of claim 25, wherein each network module implements a Butler matrix circuit.

34. The modular stripline signal processing network of claim 25, wherein each network module comprises one or more sinuous trace legs configured to exhibit a desired phase and impedance characteristic while reducing the displacement of the trace in a selected dimension.

35. A modular stripline signal processing network comprising an interconnected set of network modules, wherein each network module comprises:
  a first planar dielectric substrate defining an edge;
  a second planar dielectric substrate defining an edge;
  a ground plane;
  the first dielectric substrate, the second dielectric substrate, and the ground plane adhered together in an overlaying configuration with the ground plane located between the first and second dielectric substrates and the edges aligned to form an interface edge;

a first stripline circuit exposed on one side to the first dielectric substrate and to air on an opposing side;

a second stripline circuit exposed on one side to the second dielectric substrate and to air on an opposing side;

one or more electrical connections between the first and second stripline circuits;

one or more input ports located at the interface edge and electrically connected to the first or second stripline circuits;

one or more output ports located at the interface edge and electrically connected to the first or second stripline circuits;

the first and second stripline circuits configured to receive propagating signals at the input ports, perform a signal processing operation on the received propagating signals, and deliver processed signals to the output ports and;

each stripline circuit comprises a Butler matrix circuit.

36. The modular stripline signal processing network of claim 35, wherein, for each network module:

the first stripline circuit define a first stage hybrid junction circuit;

the second stripline circuit define a second stage hybrid junction circuit; and the electrical connections between the first and second stripline circuits participate in the implementation of one or more crossovers interconnecting the first stage and second stage hybrid junctions into a higher-order orthogonal beam forming network.

37. The modular stripline signal processing network of claim 36, wherein the input and output ports for each beam forming network module are edge-connected to another network board.

* * * * *